US012639498B2

(12) United States Patent
Yamaoka

(10) Patent No.: US 12,639,498 B2
(45) Date of Patent: May 26, 2026

(54) CIRCUIT NOISE DETERMINATION SYSTEM, CIRCUIT NOISE DETERMINATION METHOD, AND CIRCUIT NOISE DETERMINATION PROGRAM

(71) Applicant: Kioxia Corporation, Tokyo (JP)

(72) Inventor: Hiroaki Yamaoka, Setagaya Tokyo (JP)

(73) Assignee: Kioxia Corporation, Tokyo (JP)

( * ) Notice: Subject to any disclaimer, the term of this patent is extended or adjusted under 35 U.S.C. 154(b) by 631 days.

(21) Appl. No.: 18/178,467

(22) Filed: Mar. 3, 2023

(65) Prior Publication Data

US 2023/0401366 A1 Dec. 14, 2023

(30) Foreign Application Priority Data

Jun. 13, 2022 (JP) ................................. 2022-095183

(51) Int. Cl.
*G06F 30/3323* (2020.01)
*G06F 30/333* (2020.01)

(52) U.S. Cl.
CPC ........ *G06F 30/333* (2020.01); *G06F 30/3323* (2020.01)

(58) Field of Classification Search
CPC ........................... G06F 30/333; G06F 30/3323
See application file for complete search history.

(56) References Cited

U.S. PATENT DOCUMENTS 6,938,224 B2 * 8/2005 Gabara ................. G06F 30/367
703/2
10,394,999 B2 8/2019 Kurtz

FOREIGN PATENT DOCUMENTS

| JP | 2003186934 A | 7/2003 |
| JP | 2004199290 A | 7/2004 |
| JP | 4059668 B2 | 3/2008 |

OTHER PUBLICATIONS

Neethirajan et al., Machine learning-based Noise Classification and Decomposition in RF Transceivers, IEEE, 2019, pp. 1-16. (Year: 2019).*

* cited by examiner

*Primary Examiner* — Nghia M Doan

(74) *Attorney, Agent, or Firm* — Kim & Stewart LLP

(57) ABSTRACT

According to one embodiment, a circuit noise determination system includes a reading unit that reads a netlist representing a target circuit and analysis settings for noise analysis. A noise calculation unit is provided in the system to calculate noise values of circuit elements of in the target circuit according to the netlist along with a circuit classification unit that identifies and classifies circuit element in the target circuit. The system further includes a noise determination unit that outputs a notification regarding elements exceeding a noise upper limit reference value set based on a plurality of noise determinations prepared in advance for each circuit classification.

20 Claims, 38 Drawing Sheets

Figure 6:
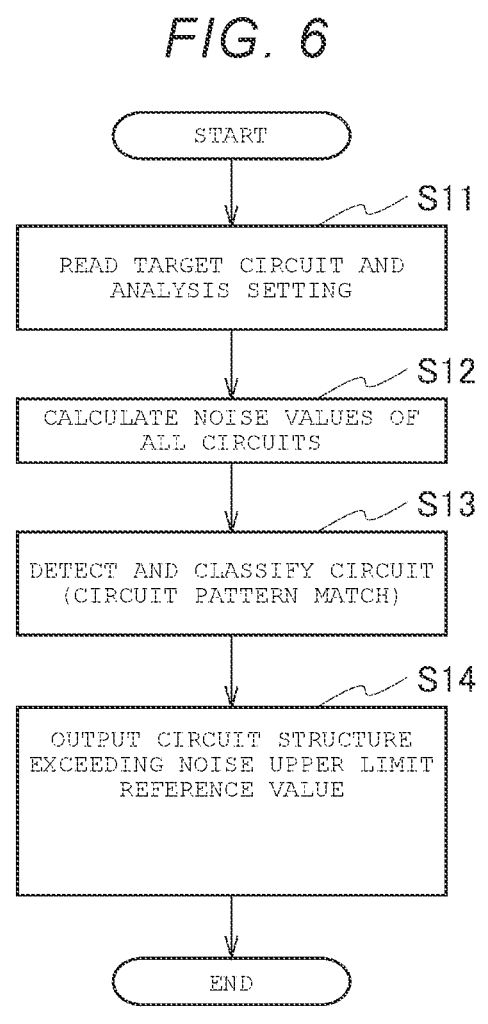

```
              START

│
                ▼            S11

READ TARGET CIRCUIT AND
      ANALYSIS SETTING

│
                ▼            S12

CALCULATE NOISE VALUES OF
        ALL CIRCUITS

│
                ▼            S13

DETECT AND CLASSIFY CIRCUIT
     (CIRCUIT PATTERN MATCH)

│
                ▼            S14

OUTPUT CIRCUIT STRUCTURE
   EXCEEDING NOISE UPPER LIMIT
        REFERENCE VALUE

│
                ▼

END
```

Figure 8B:
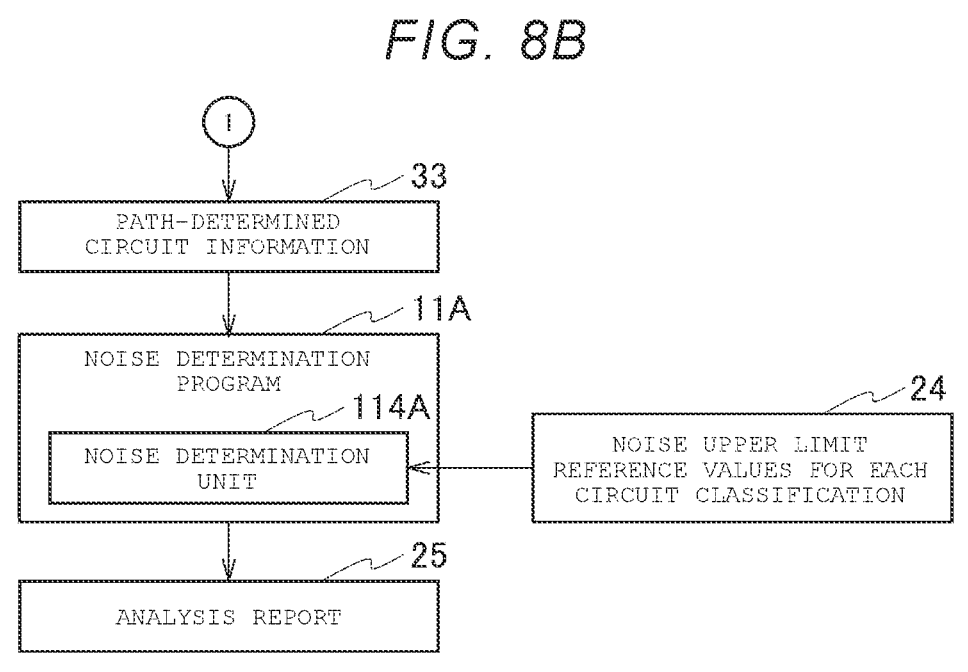

PATH-DETERMINED
CIRCUIT INFORMATION    33

NOISE DETERMINATION
PROGRAM    11A

NOISE DETERMINATION
UNIT    114A

NOISE UPPER LIMIT
REFERENCE VALUES FOR EACH
CIRCUIT CLASSIFICATION    24

ANALYSIS REPORT    25

Figure 12:
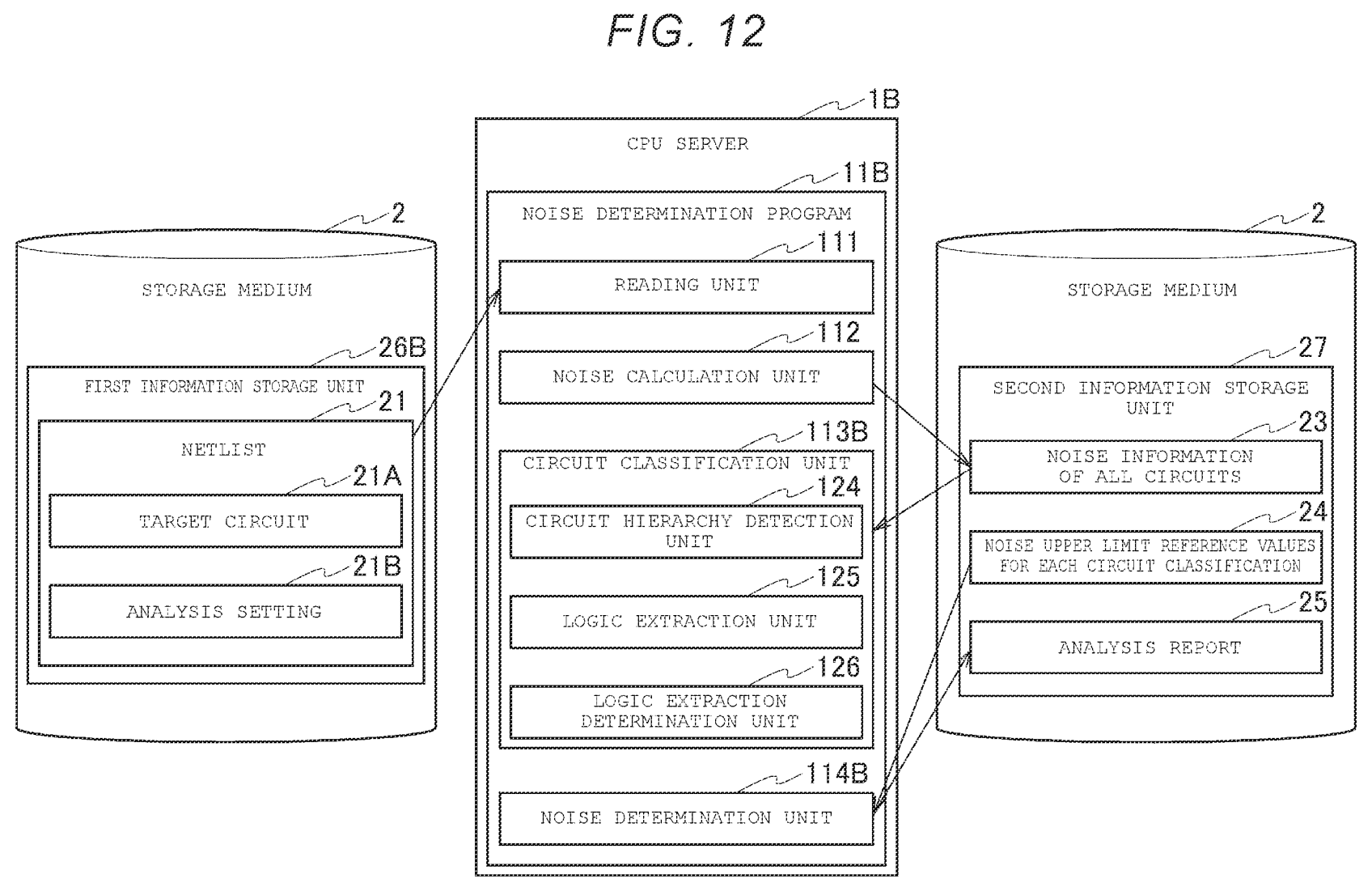

STORAGE MEDIUM — 2

SECOND INFORMATION STORAGE UNIT — 27

NOISE INFORMATION OF ALL CIRCUITS — 23

NOISE UPPER LIMIT REFERENCE VALUES FOR EACH CIRCUIT CLASSIFICATION — 24

ANALYSIS REPORT — 25

CPU SERVER — 1B

NOISE DETERMINATION PROGRAM — 11B

READING UNIT — 111

NOISE CALCULATION UNIT — 112

CIRCUIT CLASSIFICATION UNIT — 113B

CIRCUIT HIERARCHY DETECTION UNIT — 124

LOGIC EXTRACTION UNIT — 125

LOGIC EXTRACTION DETERMINATION UNIT — 126

NOISE DETERMINATION UNIT — 114B

STORAGE MEDIUM — 2

FIRST INFORMATION STORAGE UNIT — 26B

NETLIST — 21

TARGET CIRCUIT — 21A

ANALYSIS SETTING — 21B

Figure 17:
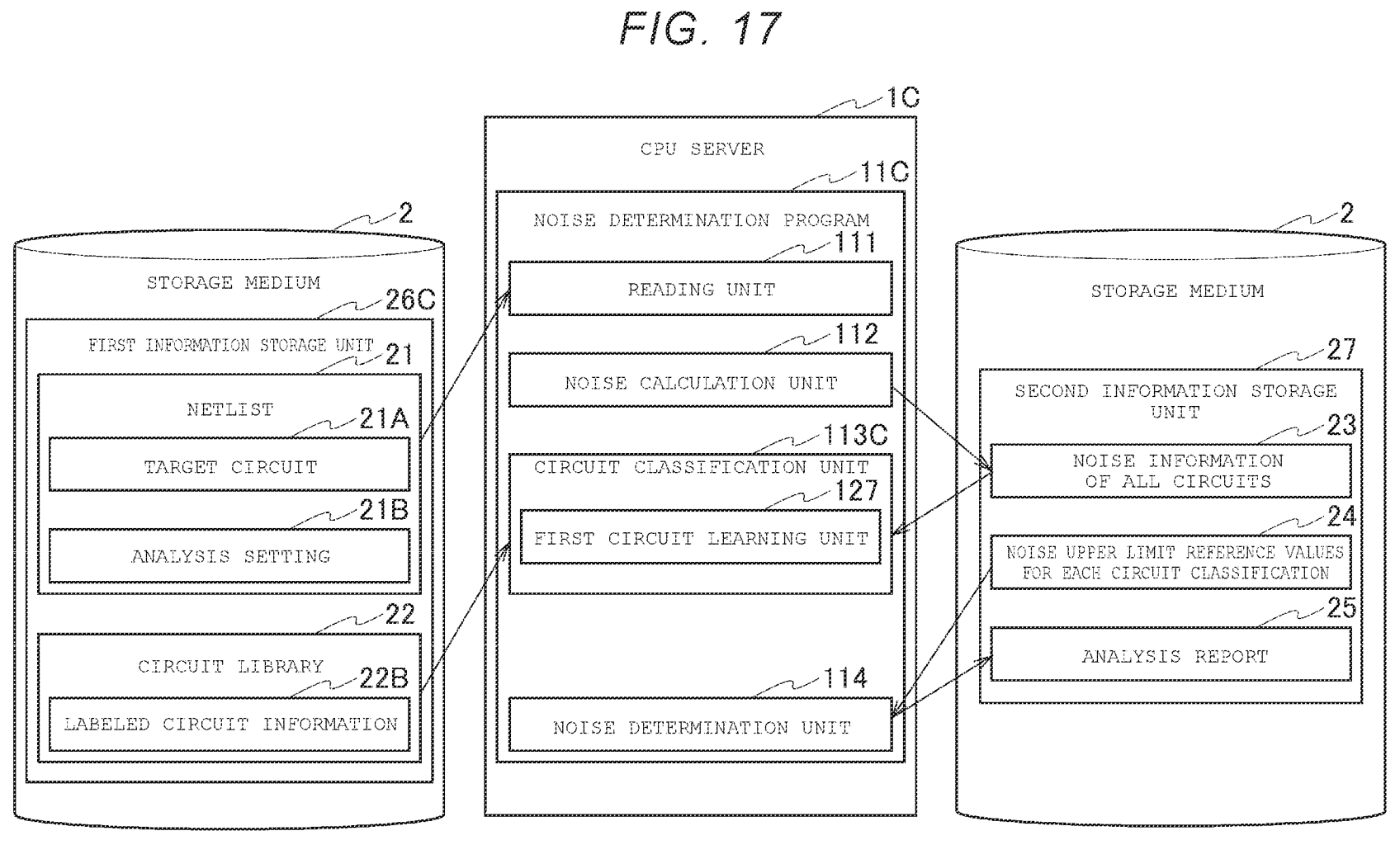

STORAGE MEDIUM 2

SECOND INFORMATION STORAGE UNIT 27

NOISE INFORMATION OF ALL CIRCUITS 23

NOISE UPPER LIMIT REFERENCE VALUES FOR EACH CIRCUIT CLASSIFICATION 24

ANALYSIS REPORT 25

CPU SERVER 1C

NOISE DETERMINATION PROGRAM 11C

READING UNIT 111

NOISE CALCULATION UNIT 112

CIRCUIT CLASSIFICATION UNIT 113C

FIRST CIRCUIT LEARNING UNIT 127

NOISE DETERMINATION UNIT 114

STORAGE MEDIUM 2

FIRST INFORMATION STORAGE UNIT 26C

NETLIST 21

TARGET CIRCUIT 21A

ANALYSIS SETTING 21B

CIRCUIT LIBRARY 22

LABELED CIRCUIT INFORMATION 22B

FIG. 20

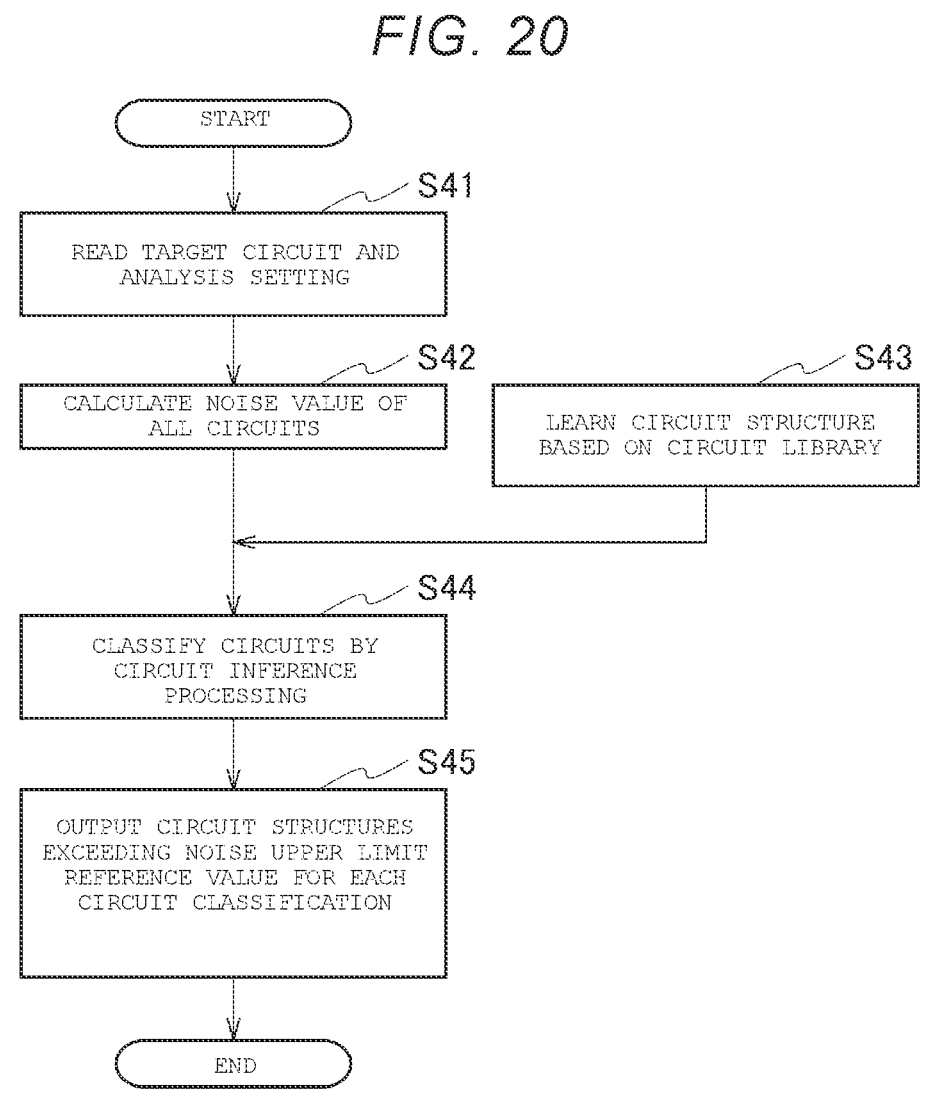

START

↓ S41

READ TARGET CIRCUIT AND
ANALYSIS SETTING

↓ S42

CALCULATE NOISE VALUE OF
ALL CIRCUITS

S43

LEARN CIRCUIT STRUCTURE
BASED ON CIRCUIT LIBRARY

↓ S44

CLASSIFY CIRCUITS BY
CIRCUIT INFERENCE
PROCESSING

↓ S45

OUTPUT CIRCUIT STRUCTURES
EXCEEDING NOISE UPPER LIMIT
REFERENCE VALUE FOR EACH
CIRCUIT CLASSIFICATION

↓

END

*FIG. 21*

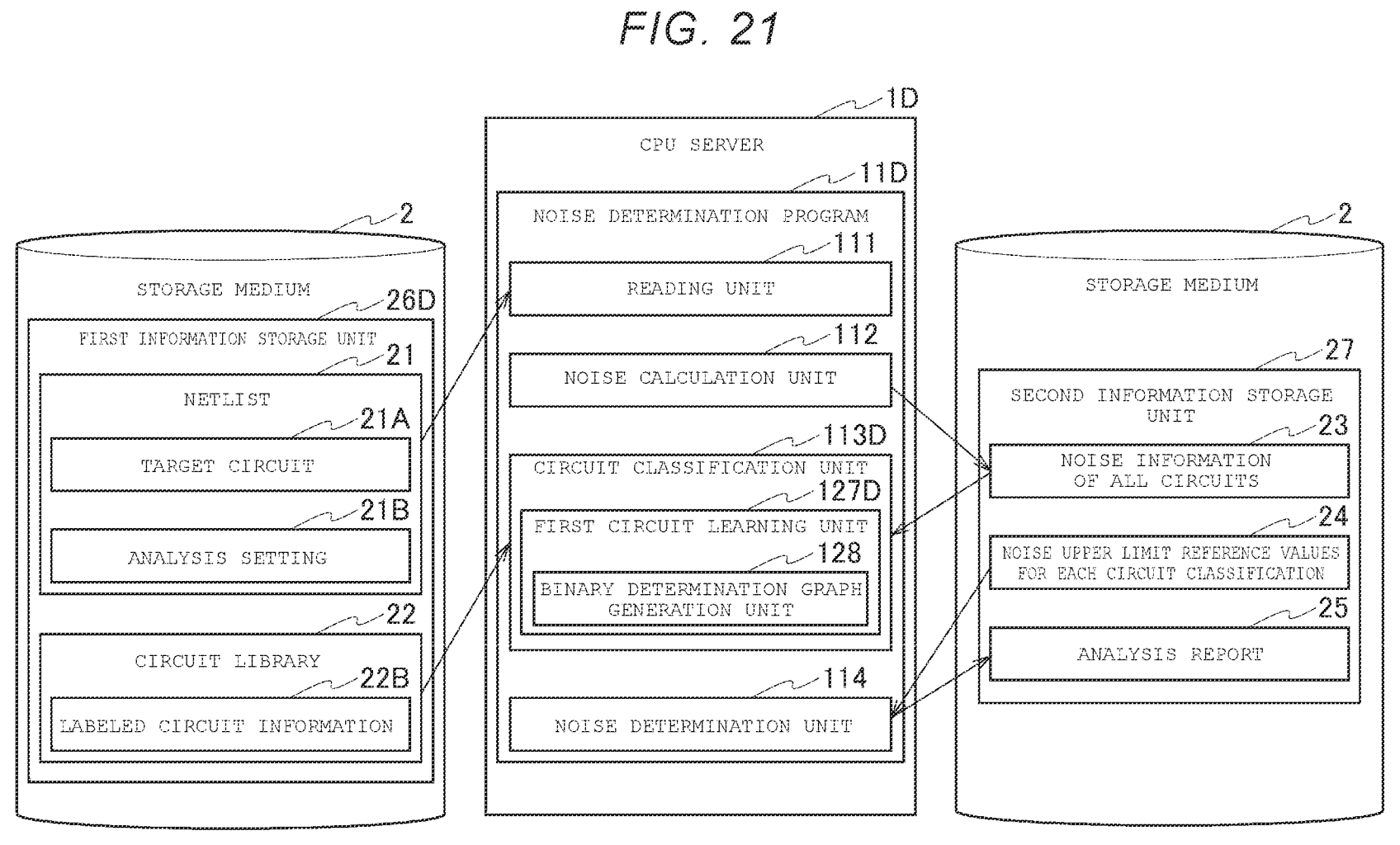

STORAGE MEDIUM    2

SECOND INFORMATION STORAGE UNIT    27

NOISE INFORMATION OF ALL CIRCUITS    23

NOISE UPPER LIMIT REFERENCE VALUES FOR EACH CIRCUIT CLASSIFICATION    24

ANALYSIS REPORT    25

CPU SERVER    1D

NOISE DETERMINATION PROGRAM    11D

READING UNIT    111

NOISE CALCULATION UNIT    112

CIRCUIT CLASSIFICATION UNIT    113D

FIRST CIRCUIT LEARNING UNIT    127D

BINARY DETERMINATION GRAPH GENERATION UNIT    128

NOISE DETERMINATION UNIT    114

STORAGE MEDIUM    2

FIRST INFORMATION STORAGE UNIT    26D

NETLIST    21

TARGET CIRCUIT    21A

ANALYSIS SETTING    21B

CIRCUIT LIBRARY    22

LABELED CIRCUIT INFORMATION    22B

FIG. 24

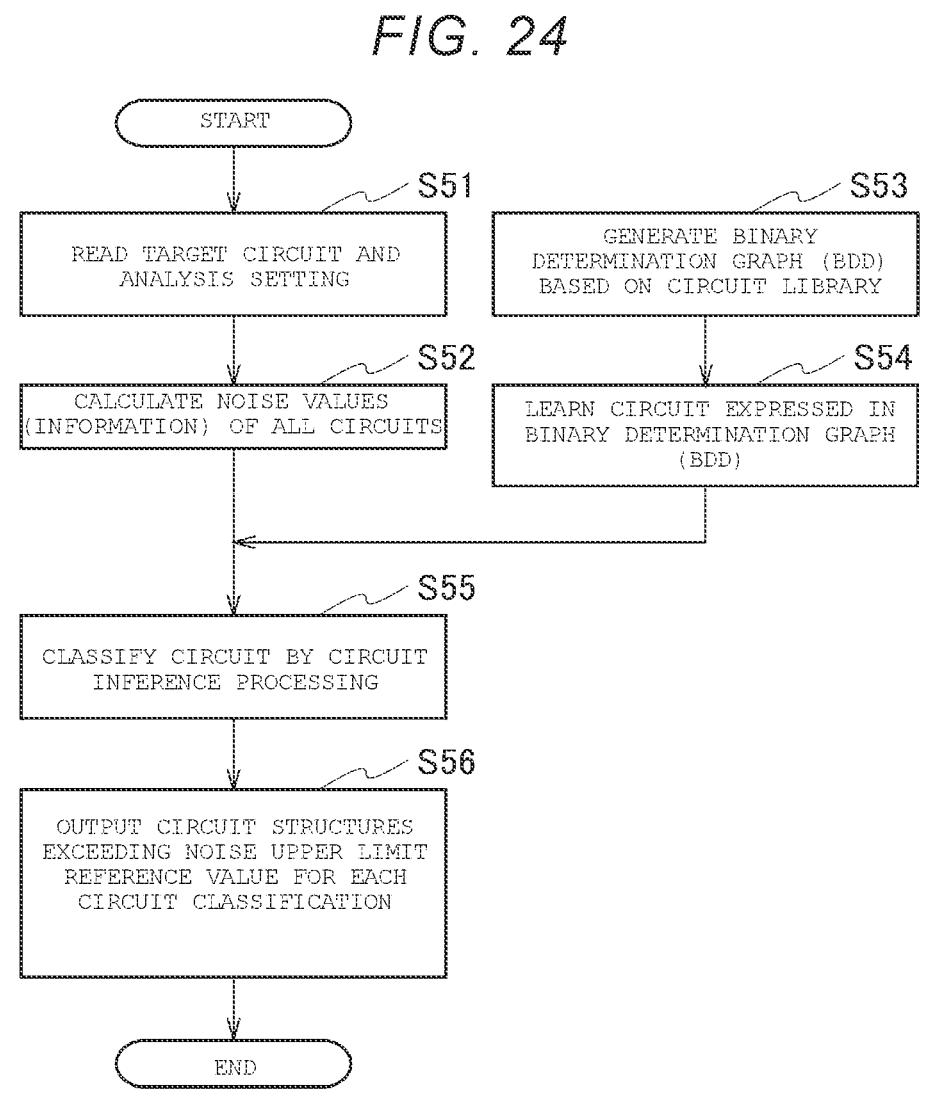

START

↓ S51

READ TARGET CIRCUIT AND
ANALYSIS SETTING

S53

GENERATE BINARY
DETERMINATION GRAPH (BDD)
BASED ON CIRCUIT LIBRARY

↓ S52

CALCULATE NOISE VALUES
(INFORMATION) OF ALL CIRCUITS

S54

LEARN CIRCUIT EXPRESSED IN
BINARY DETERMINATION GRAPH
(BDD)

↓ S55

CLASSIFY CIRCUIT BY CIRCUIT
INFERENCE PROCESSING

↓ S56

OUTPUT CIRCUIT STRUCTURES
EXCEEDING NOISE UPPER LIMIT
REFERENCE VALUE FOR EACH
CIRCUIT CLASSIFICATION

↓

END

*FIG. 28*

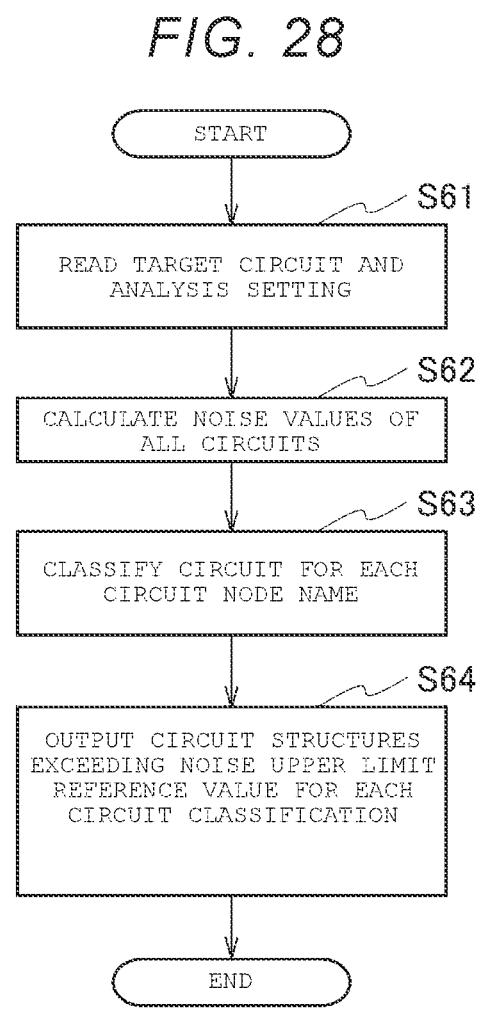

```
        ( START )
            │
            │        ⌇ S61
            ▼
  ┌─────────────────────┐
  │ READ TARGET CIRCUIT AND │
  │   ANALYSIS SETTING   │
  └─────────────────────┘
            │
            │        ⌇ S62
            ▼
  ┌─────────────────────┐
  │ CALCULATE NOISE VALUES OF │
  │     ALL CIRCUITS     │
  └─────────────────────┘
            │
            │        ⌇ S63
            ▼
  ┌─────────────────────┐
  │ CLASSIFY CIRCUIT FOR EACH │
  │   CIRCUIT NODE NAME  │
  └─────────────────────┘
            │
            │        ⌇ S64
            ▼
  ┌─────────────────────┐
  │  OUTPUT CIRCUIT STRUCTURES │
  │ EXCEEDING NOISE UPPER LIMIT │
  │  REFERENCE VALUE FOR EACH  │
  │   CIRCUIT CLASSIFICATION   │
  └─────────────────────┘
            │
            ▼
        (  END  )
```

*FIG. 29*

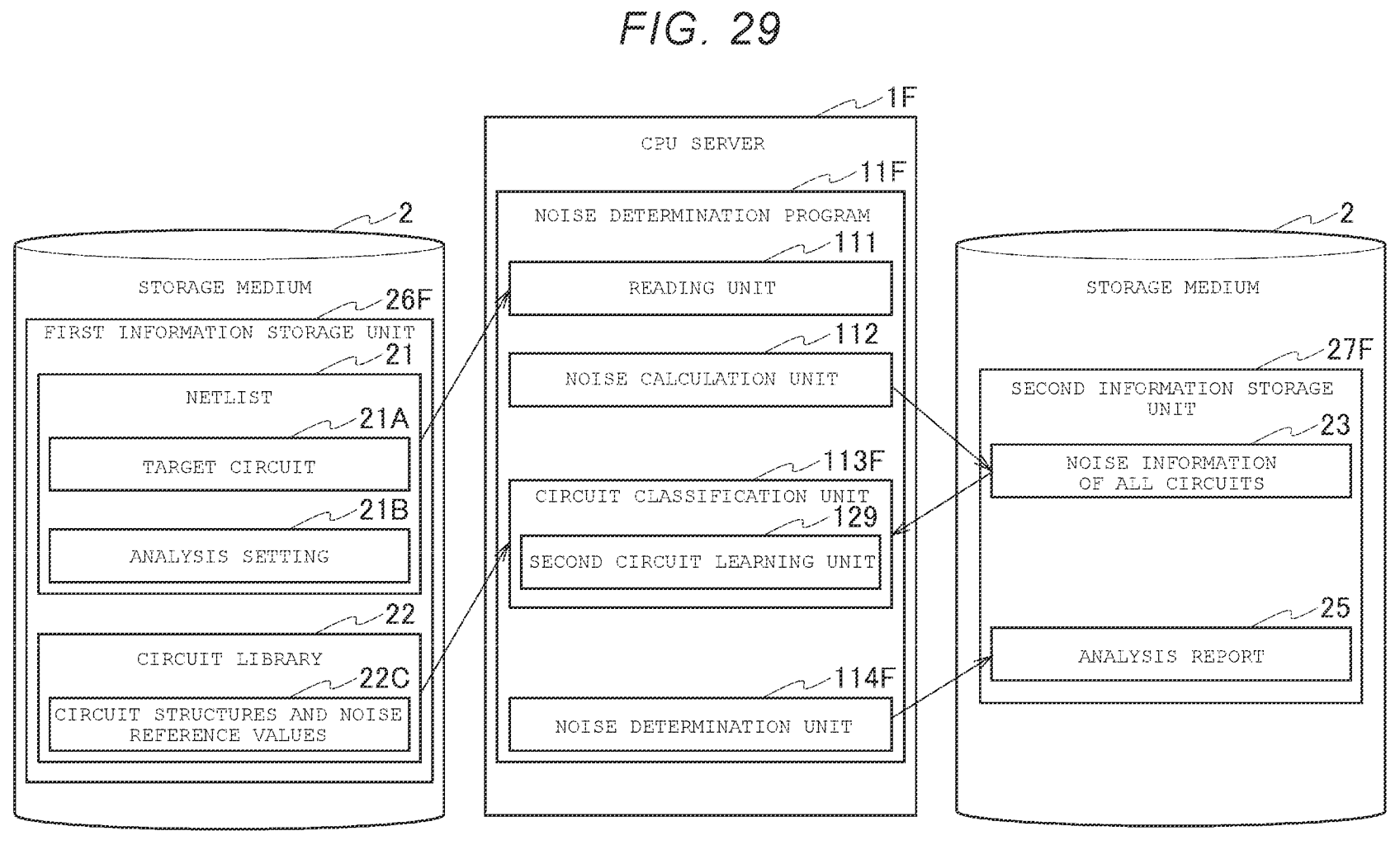

STORAGE MEDIUM — 2

SECOND INFORMATION STORAGE UNIT — 27F

NOISE INFORMATION OF ALL CIRCUITS — 23

ANALYSIS REPORT — 25

CPU SERVER — 1F

NOISE DETERMINATION PROGRAM — 11F

READING UNIT — 111

NOISE CALCULATION UNIT — 112

CIRCUIT CLASSIFICATION UNIT — 113F

SECOND CIRCUIT LEARNING UNIT — 129

NOISE DETERMINATION UNIT — 114F

STORAGE MEDIUM — 2

FIRST INFORMATION STORAGE UNIT — 26F

NETLIST — 21

TARGET CIRCUIT — 21A

ANALYSIS SETTING — 21B

CIRCUIT LIBRARY — 22

CIRCUIT STRUCTURES AND NOISE REFERENCE VALUES — 22C

FIG. 30B

```
                    ( 5 )
                      │
                      ▼         ╭⁓ 31F
        ┌─────────────────────────────┐
        │   CIRCUIT CLASSIFICATION    │
        │        INFORMATION          │
        └─────────────────────────────┘
                      │           ╭⁓ 11F
                      ▼
        ┌─────────────────────────────┐
        │   NOISE DETERMINATION       │
        │         PROGRAM             │
        │                    ╭⁓ 114F  │
        │  ┌───────────────────────┐  │
        │  │ NOISE DETERMINATION   │  │
        │  │        UNIT           │  │
        │  └───────────────────────┘  │
        └─────────────────────────────┘
                      │           ╭⁓ 25
                      ▼
        ┌─────────────────────────────┐
        │      ANALYSIS REPORT        │
        └─────────────────────────────┘
```

FIG. 31

CIRCUIT NOISE DETERMINATION SYSTEM, CIRCUIT NOISE DETERMINATION METHOD, AND CIRCUIT NOISE DETERMINATION PROGRAM

CROSS-REFERENCE TO RELATED APPLICATION(S)

This application is based upon and claims the benefit of priority from Japanese Patent Application No. 2022-095183, filed Jun. 13, 2022, the entire contents of which are incorporated herein by reference.

FIELD

Embodiments described herein relate generally to a circuit noise determination system, a circuit noise determination method, and a circuit noise determination program.

BACKGROUND

In the related art, a design method is used in which a uniform upper noise limit is set for an entire circuit in the noise analysis of a transistor-based circuit and an error is determined by comparing the calculated noise to the set upper noise limit. However, if a noise countermeasure is implemented by uniformly setting the upper limit of noise, the appropriate countermeasure may not necessarily be implemented depending on a target integrated circuit.

BRIEF DESCRIPTION OF THE DRAWINGS

FIG. 2 is a block diagram of a circuit noise determination system according to a first embodiment.

FIG. 6 is an example of a circuit noise determination method according to a first embodiment.

FIGS. 8A and 8B depict relationships between blocks and data in a circuit noise determination system according to a second embodiment.

FIG. 9 relates to aspects of a circuit classification unit according to a second embodiment.

FIG. 12 is a block diagram of a circuit noise determination system according to a third embodiment.

FIG. 14 relates to aspects of a circuit classification unit according to a third embodiment.

FIG. 16 is an example of a circuit noise determination method according to a third embodiment.

FIG. 17 is a block diagram of a circuit noise determination system according to a fourth embodiment.

FIG. 20 relates to aspects of a circuit noise determination method according to a fourth embodiment.

FIG. 21 is a block diagram of a circuit noise determination system according to a fifth embodiment.

FIG. 24 is an example of a circuit noise determination method according to a fifth embodiment.

FIG. 28 is an example of a circuit noise determination method according to a sixth embodiment.

FIG. 29 is a block diagram of a circuit noise determination system according to a seventh embodiment.

FIGS. 30A and 30B depict relationships between blocks and data in a circuit noise determination system according to a seventh embodiment.

FIG. 31 relates to aspects of a circuit classification unit according to a seventh embodiment.

DETAILED DESCRIPTION

Embodiments provide a circuit noise determination system, a circuit noise determination method, and a circuit noise determination program capable of detecting minute noise generated in a noise-sensitive circuit while preventing generation of a pseudo error.

In general, according to one embodiment, a circuit noise determination system includes a reading unit that reads a netlist representing a target circuit and including noise analysis settings. A noise calculation unit calculates noise values of circuit elements in the target circuit according to the netlist. A circuit classification unit identifies and classifies the elements in the target circuit. A noise determination unit outputs a notification of circuit elements in the target circuit that exceed a noise upper limit reference value set for each circuit classification based a plurality of noise determinations performed for each circuit classification. In general, the various units of the system may be implemented by execution of software programs on a CPU server device or otherwise.

Next, certain example embodiments will be described with reference to the drawings. In the description below, the same or substantially similar parts/components/aspects are denoted by the same reference symbols. The drawings are schematic.

The drawings are schematic and the specifically described embodiments are non-limiting examples provided for purposes of explaining the technical ideas, concepts, and the like of the present disclosure. The depiction and description of these examples do not necessarily limit the particular materials, shapes, structures, positioning, and the like of each component that might be adopted in accordance with the present disclosure. Various modifications of such aspects and the like may be made to these example embodiments and still remain within the contemplated scope of the present disclosure.

First Embodiment (Circuit Noise Determination System)

Figure 1:
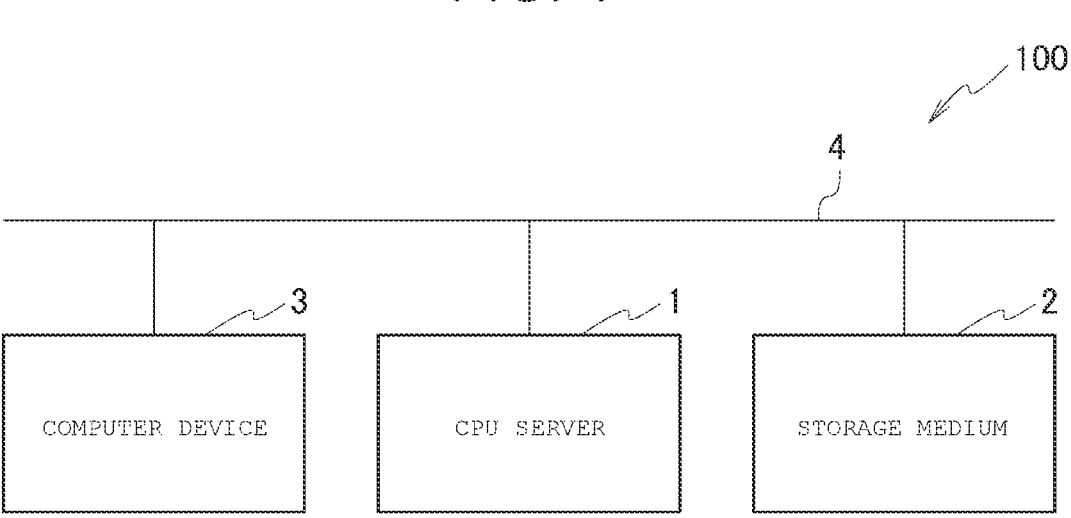
FIG. 1 is a schematic diagram of a circuit noise determination system according to certain embodiments.

A circuit noise determination system 100 includes a central processing unit (CPU) server 1, a storage medium 2, a computer device 3, and a network 4, as shown in FIG. 1.

The circuit noise determination system 100 connects the computer device 3, the CPU server 1, and the storage medium 2 via a network 4. The computer device 3 is operated by a user. The CPU server 1 stores computer programs used in the circuit noise determination system 100. The storage medium 2 stores input information and noise determination result information necessary for executing a computer program used in the circuit noise determination system 100.

For example, the CPU server 1 may be an engineering workstation, a mainframe, or a supercomputer. For example, the storage medium 2 may be an external storage device such as a hard disk, a semiconductor storage device such as a solid-state drive, or another storage medium (media). For example, the computer device 3 may be a personal computer (PC), a thin client terminal, a mobile terminal, or a personal digital assistant (PDA). For example, the network 4 may be the Internet, an intranet, a LAN, a telephone communication network, or a dedicated line.

Figure 2:
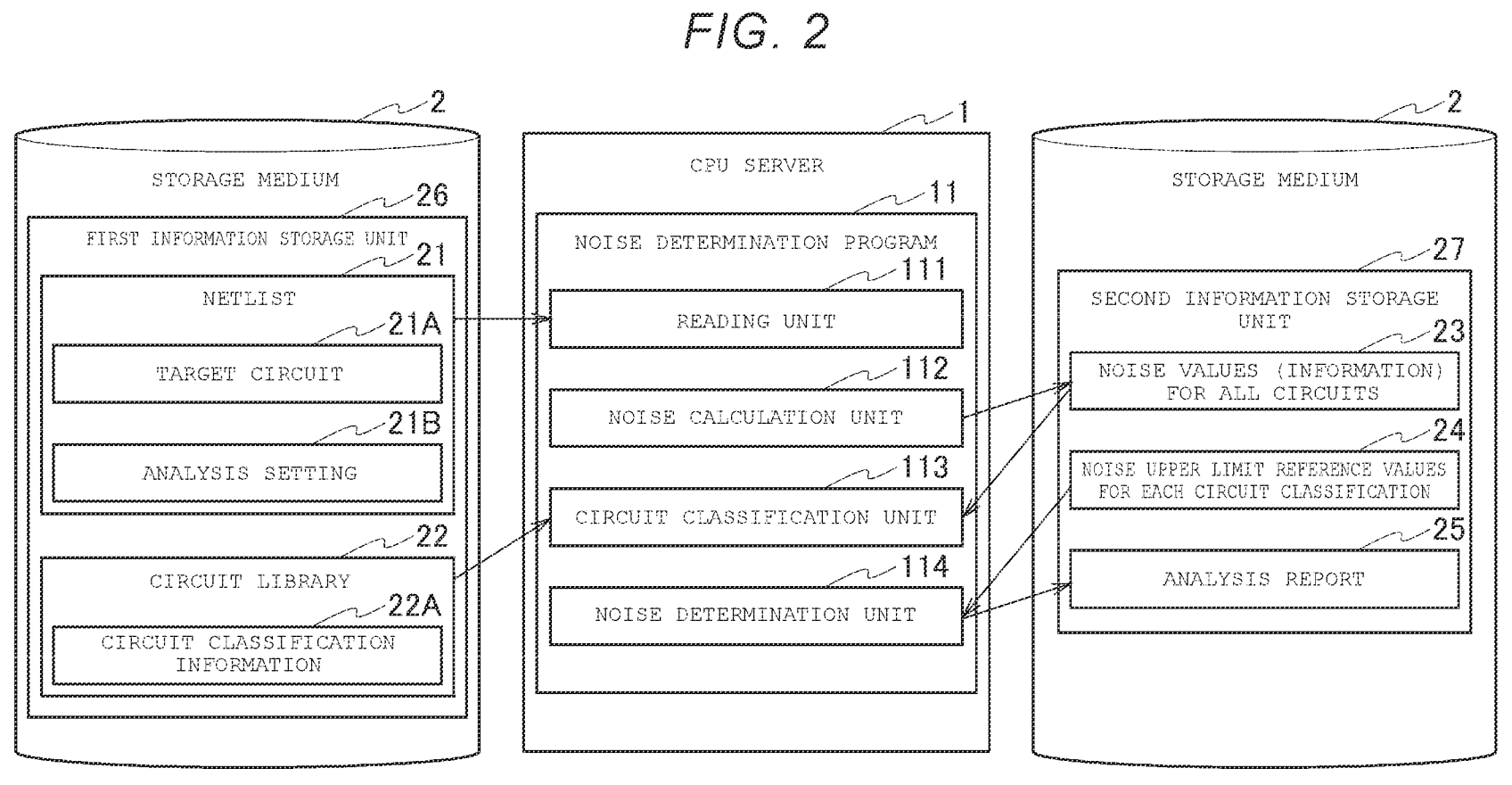

As shown in FIG. 2, the CPU server 1 includes a circuit noise determination program 11 (e.g., a computer software program to be executed) used in the circuit noise determination system 100. In the following description, the circuit noise determination program 11 is also referred to as the noise determination program 11.

In some examples, the noise determination program 11 may be a processing device such as a CPU or a microprocessor, or a semiconductor integrated circuit having similar functions to those described.

The noise determination program 11 when executed (or in otherwise in operation) provides a reading unit 111, a noise calculation unit 112, a circuit classification unit 113, and a noise determination unit 114. The noise determination program 11 outputs noise determination result information to an analysis report 25 after executing the noise determination. The reading unit 111, the noise calculation unit 112, the circuit classification unit 113, and the noise determination unit 114 will be further described with reference to FIG. 3.

The storage medium 2 has a first information storage unit 26 and a second information storage unit 27. The first information storage unit 26 includes a netlist 21 and a circuit library 22. The second information storage unit 27 includes the noise information 23 of all circuits, a noise upper limit reference value 24 for each circuit classification, and an analysis report 25.

As shown in FIG. 2, the netlist 21 includes a target circuit 21A and an analysis setting 21B. The netlist 21 describes a circuit to be analyzed by the circuit noise determination system 100. The netlist 21 is an example of input information necessary for executing a computer program used in the circuit noise determination system 100.

For example, the target circuit 21A has information on passive elements and active elements that make up the circuit being analyzed, and a node (or nodes) to which these elements are connected. The target circuit 21A may be configured with one or a plurality of sub-circuits or elements. The circuit targeted for noise analysis in this example is a transistor-based circuit, and the minimum unit of circuit design in this context is a transistor. In the following description, the overall circuit (circuit design) being analyzed by the circuit noise determination system 100 is referred to as a target circuit 21A.

The power setting(s) and the like used for analysis will be referred to as an analysis setting 21B. For example, the analysis setting 21B is power supply setting information such as an input voltage and/or an input signal supplied to the target circuit 21A.

As shown in FIG. 2, the circuit library 22 has circuit classification information 22A. Circuit information for a plurality of circuit structures (or elements) is registered in the circuit classification information 22A. The circuit library 22 is an example of input information necessary for executing the computer program used in the circuit noise determination system 100.

The circuit classification information 22A has circuit structure information prepared in advance for each circuit element type (sub-circuit) that might be incorporated in a circuit design. Here, the circuit classification information 22A is at least registered by circuit type as a digital circuit or an analog circuit. For example, the digital circuit may be a logic circuit such as an AND circuit, an OR circuit, a NAND circuit, a 2-input NAND circuit, an inverter, a multiplexer, an adder, or a multiplier. For example, the analog circuit may be a circuit that handles an analog signal such as an operational amplifier, a differential amplifier circuit, a current mirror circuit, a charge pump circuit, or a phase locked loop (PLL). The circuit classification information 22A is for a transistor-based circuit, and the minimum unit of the registered circuit structures is a transistor.

The information (noise information 23) output by the noise calculation unit 112 incorporates a noise value for individual circuit elements (sub-circuits) of target circuit 21A when in the particular context of the overall design of target circuit 21A and intended/expected operation conditions. Here, the calculated noise value includes noise components such as crosstalk noise, propagation noise, and power supply noise (substrate noise). That is, these noise values (collectively noise information 23) incorporates the noise values particularly associated with the circuit structure represented in the target circuit 21A and can be provided for each input/output node of each circuit structure (element/sub-circuit). In the following description, the noise values calculated (simulated) for the circuit structures represented in the target circuit 21A and provided for each input/output node of these circuit structures is referred to as the "noise information 23 of all circuits" or "noise information 23."

The noise upper limit reference value 24 for each circuit classification provides a noise upper limit reference value of the node in each circuit configuration for each circuit information. Here, the noise upper limit reference value 24 for each circuit classification is the noise upper limit reference value corresponding to the circuit structure for each circuit structure. The noise upper limit reference values 24 may be set in advance. Specifically, the noise upper limit reference value 24 may be calculated in advance by circuit simulation for each of the circuit types. If one circuit type has multiple circuits with different configurations and thus multiple noise upper limit reference values, the highest noise upper limit value (worst case) for each circuit type may be set as the representative value.

For example, the analysis report 25 stores or incorporates noise determination result information output by the noise determination unit 114. The noise determination result information may be information indicating the noise value, the noise upper limit reference value, the target circuit, and/or the node. The analysis report 25 is an example of noise determination result information necessary for executing the computer program used in the circuit noise determination system 100. The netlist 21 is an example of noise determination result information necessary for executing the computer program used in the circuit noise determination program 11.

Figure 3:
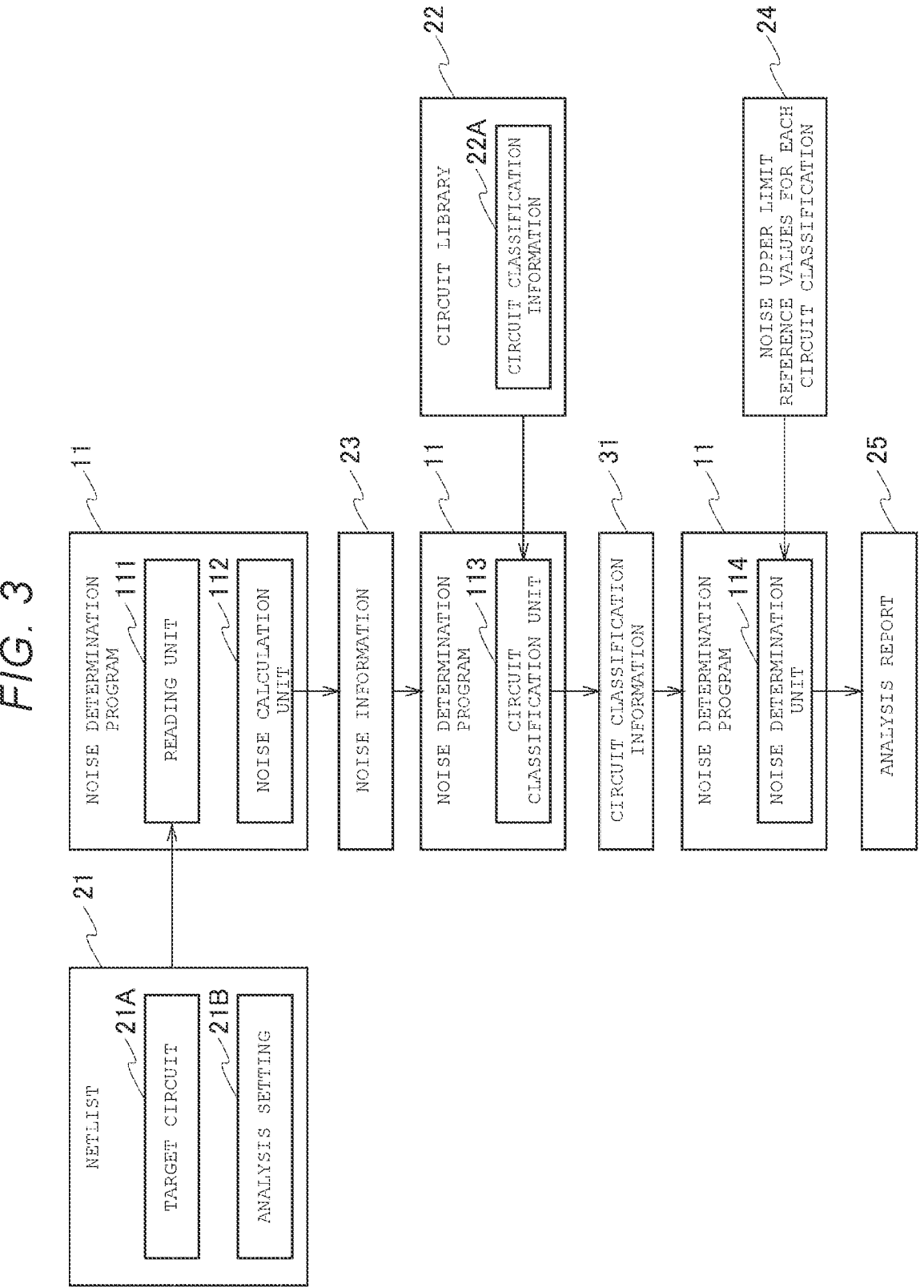
FIG. 3 depicts relationship between blocks and data in a circuit noise determination system according to a first embodiment.

As shown in FIG. 3, the reading unit 111 reads the netlist 21 for the target circuit 21A and the analysis setting 21B before the noise analysis.

The noise calculation unit 112 calculates the noise value of all circuits in the target circuit 21A according to the netlist 21. The noise calculation unit 112 outputs the calculated noise values of all the circuits as the noise information 23. The noise calculation unit 112 may add the noise values calculated for each circuit structure to the corresponding circuit structure as represented in the target circuit 21A and output the result in this manner.

The circuit classification unit 113 detects and classifies the digital circuits and the analog circuits in the target circuit 21A based on the circuit library 22 (in which a plurality of circuit structures is registered). Further, the circuit classification unit 113 classifies the circuit structures in the target circuit 21A by circuit type, and outputs the circuit classification information as the circuit classification information 31. For example, the circuit classification unit 113 may read the circuit library 22 (the circuit classification information 22A) and the noise information 23 of all circuits. Further, the circuit classification unit 113 may output the circuit classification information to the noise determination unit 114. The circuit classification unit 113 will be further described with reference to FIG. 4.

Based on the noise upper limit reference value 24 for each circuit classification, the noise determination unit 114 outputs the components of the target circuit 21A exceeding the noise upper limit reference value 24 for each circuit classification to the analysis report 25. The noise determination unit 114 may read the noise upper limit reference value 24 for each circuit classification. The noise determination unit 114 will be further described with reference to FIG. 5.

Figure 4:
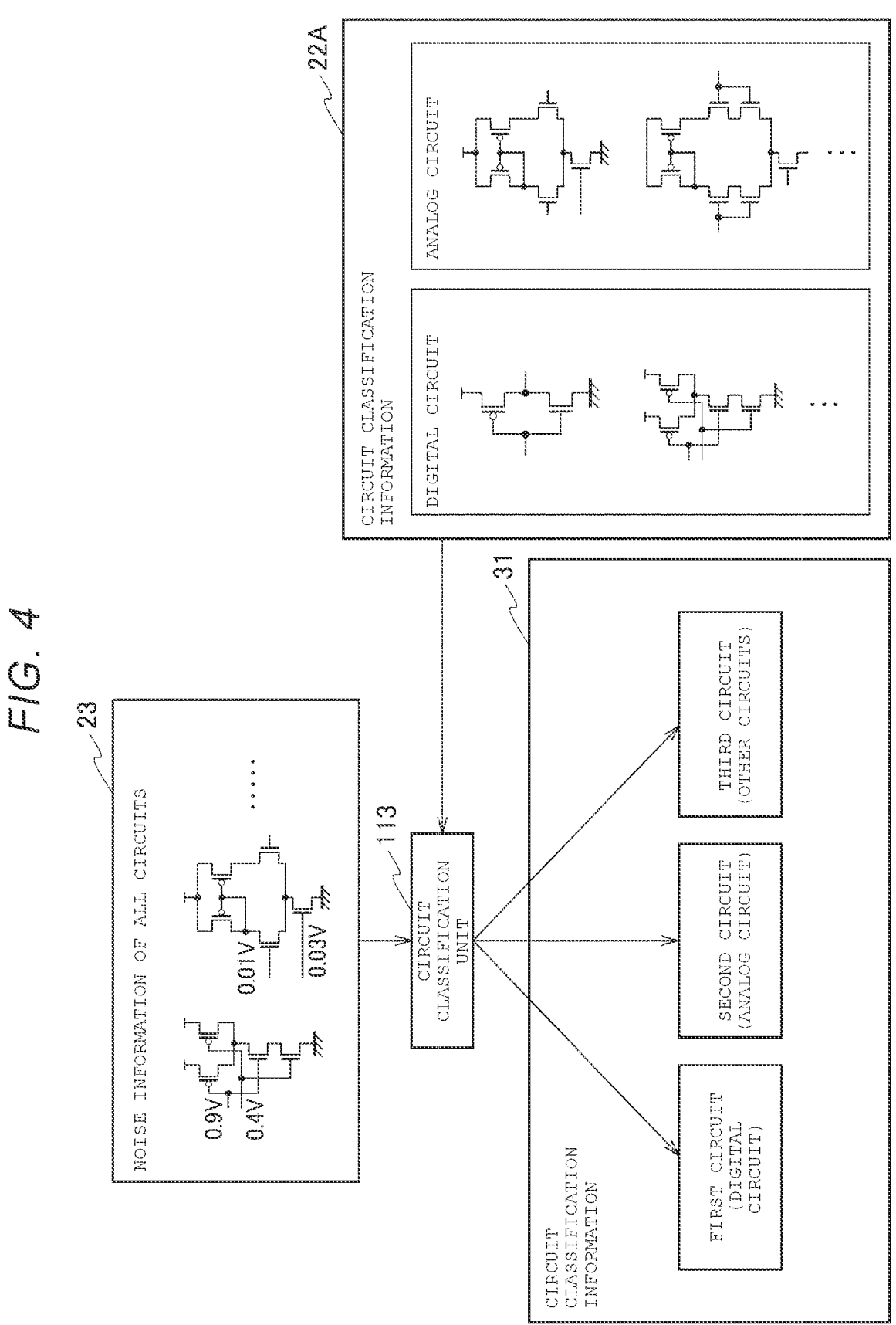
FIG. 4 relates to aspects of a circuit classification unit according to a first embodiment.

As shown in FIG. 4, the circuit classification unit 113 classifies the circuit structures in the target circuit 21A based on the circuit classification information 22A. Specifically, the circuit classification unit 113 reads the circuit classification information 22A, which is prepared in advance.

Next, the circuit classification unit 113 reads the noise information 23. Furthermore, the circuit classification unit 113 collates the circuit structures of the target circuit 21A in the noise information 23 with the circuit structures provided in the circuit classification information 22A, detects a matching circuit structure, and classifies the circuit structures of the target circuit 21A for each circuit type in the circuit classification information 22A.

As shown in FIG. 4, the circuit classification unit 113 collates a 2-input NAND circuit in the noise information 23 to a 2-input NAND circuit registered in the circuit classification information 22A as a digital circuit, detects a matching circuit structure, and classifies the matching circuit structure as a first circuit type (digital circuit). Similarly, the circuit classification unit 113 collates a differential amplifier circuit in the noise information 23 with the differential amplifier circuit registered as an analog circuit in the circuit classification information 22A, detects a matching circuit structure, and classifies the matching circuit structure in the circuit classification information 31 as a second circuit type (analog circuit). The circuit classification unit 113 may detect a case where the circuit structure in the noise information 23 is not provided (found) in the circuit structures registered in the circuit classification information 22A, or a case where the circuit structure in the noise information 23 is an analog circuit that is resistant to noise, or the like as a third circuit type (other circuits) and classify the case in the circuit classification information 31 as such.

Figure 5:
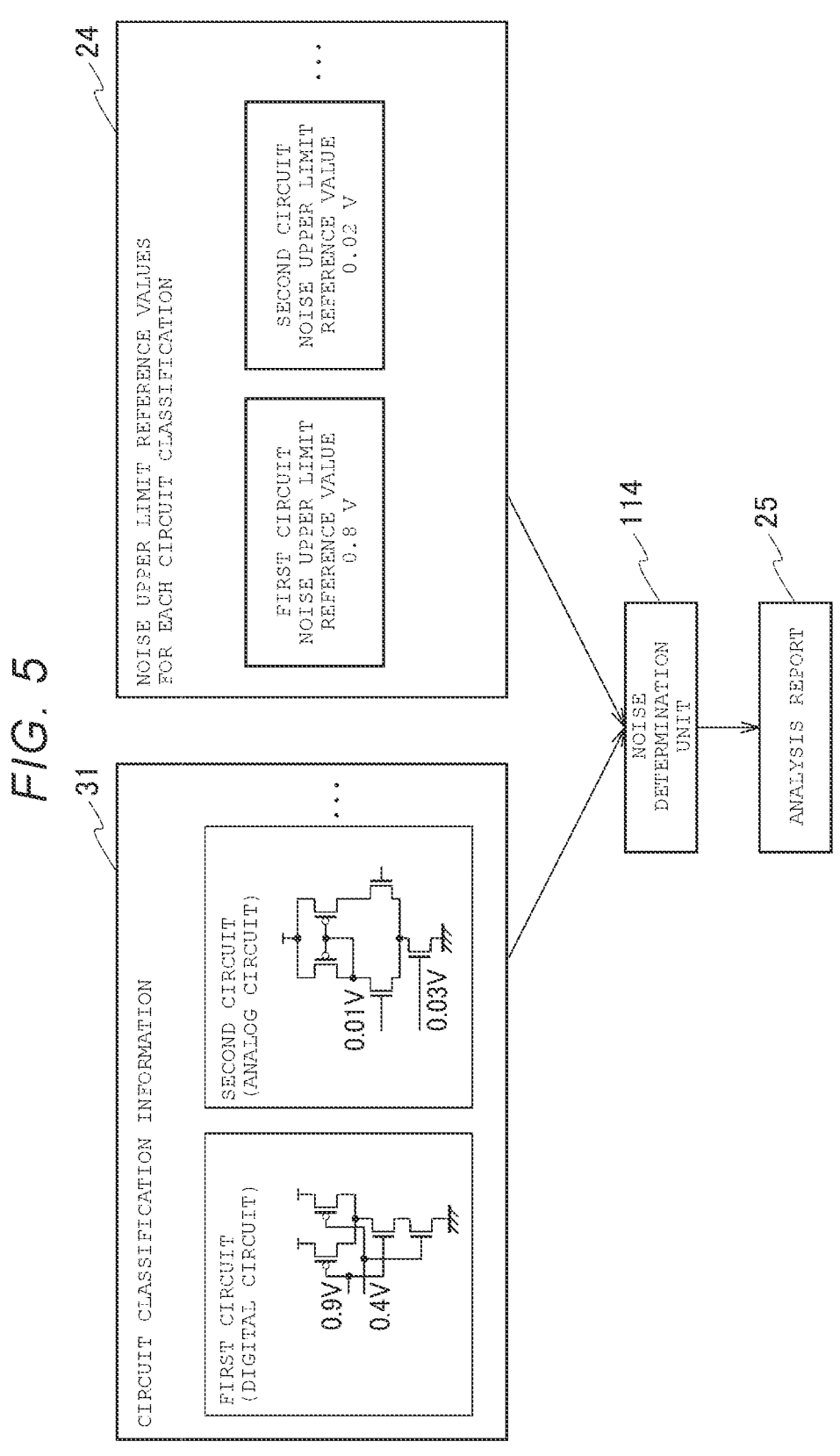
FIG. 5 relates to aspects of a noise determination unit according to a first embodiment.

As shown in FIG. 5, the noise determination unit 114 determines the noise value of the circuit structure of the target circuit 21A provided in the circuit classification information 31 based on the noise upper limit reference value 24 for each circuit classification. Specifically, the noise determination unit 114 reads the noise upper limit reference values (first circuit: 0.8V and second circuit: 0.02V) provided in the noise upper limit reference value 24 for each circuit classification, which is preset.

Next, the noise determination unit 114 reads the circuit classification information 31. The noise determination unit 114 compares the noise value of the circuit classification information 31 with the noise upper limit reference value of the noise upper limit reference value 24 for each circuit classification.

As shown in FIG. 5, since the noise value (0.9V) of the first circuit exceeds the noise upper limit reference value (0.8V) for the first circuit, the noise determination unit 114 outputs the first circuit to the analysis report 25. Similarly, since the noise value (0.03V) of the second circuit exceeds the noise upper limit reference value (0.02V) for the second circuit, the noise determination unit 114 outputs the second circuit to the analysis report 25.

(Circuit Noise Determination Method)

As shown in FIG. 6, first, in step S11, the reading unit 111 reads the netlist 21 (FIG. 2) having the noise analysis target circuit 21A and the analysis setting 21B.

Next, in step S12, the noise calculation unit 112 calculates noise value of all circuits according to the netlist 21. The noise calculation unit 112 analyzes, for example, a signal slew value of each node, a wiring-to-ground capacitance value of each node, and a coupling capacitance value between each node for each circuit configuration provided in the target circuit 21A, and calculates the noise value of each node.

Next, in step S13, the circuit classification unit 113 detects and classifies the digital circuit and the analog circuit provided in the target circuit 21A based on the circuit library 22 (FIG. 2) in which a plurality of circuit structures are registered. Specifically, the circuit classification unit 113 collates the circuit structure in the target circuit 21A with the circuit structures of the circuit classification information 22A provided in the circuit library, detects, and classifies them, and the processing proceeds to step S14. That is, the target circuit 21A is classified as a digital circuit or an analog circuit by the circuit classification unit 113. The circuit classification unit 113 outputs circuit information (now classified into digital and analog circuits) to the noise determination unit 114. The detecting and classifying of the digital circuits and the analog circuits in the target circuit 21A by the circuit classification unit 113 based on the content of the circuit library 22 can also be called circuit pattern matching.

Finally, in step S14, based on the noise upper limit reference value for a plurality of noise determinations prepared for each circuit classification, the noise determination unit 114 (FIG. 2) outputs the circuit structure exceeding the noise upper limit reference value to the analysis report 25, with respect to the noise value generated by the circuit structure of the target circuit 21A provided in the circuit classification information 31. Then, after the output, the processing is terminated.

Effect of First Embodiment

As described above, according to the first embodiment, by classifying target circuits into the digital circuit and the analog circuit, and comparing the noise value for each classified circuit configuration with the noise upper limit reference value for each circuit classification, it is possible to provide a circuit noise determination system capable of detecting minute noise generated in a noise-sensitive circuit while preventing the generation of pseudo errors.

Second Embodiment (Circuit Noise Determination System)

Figure 7:
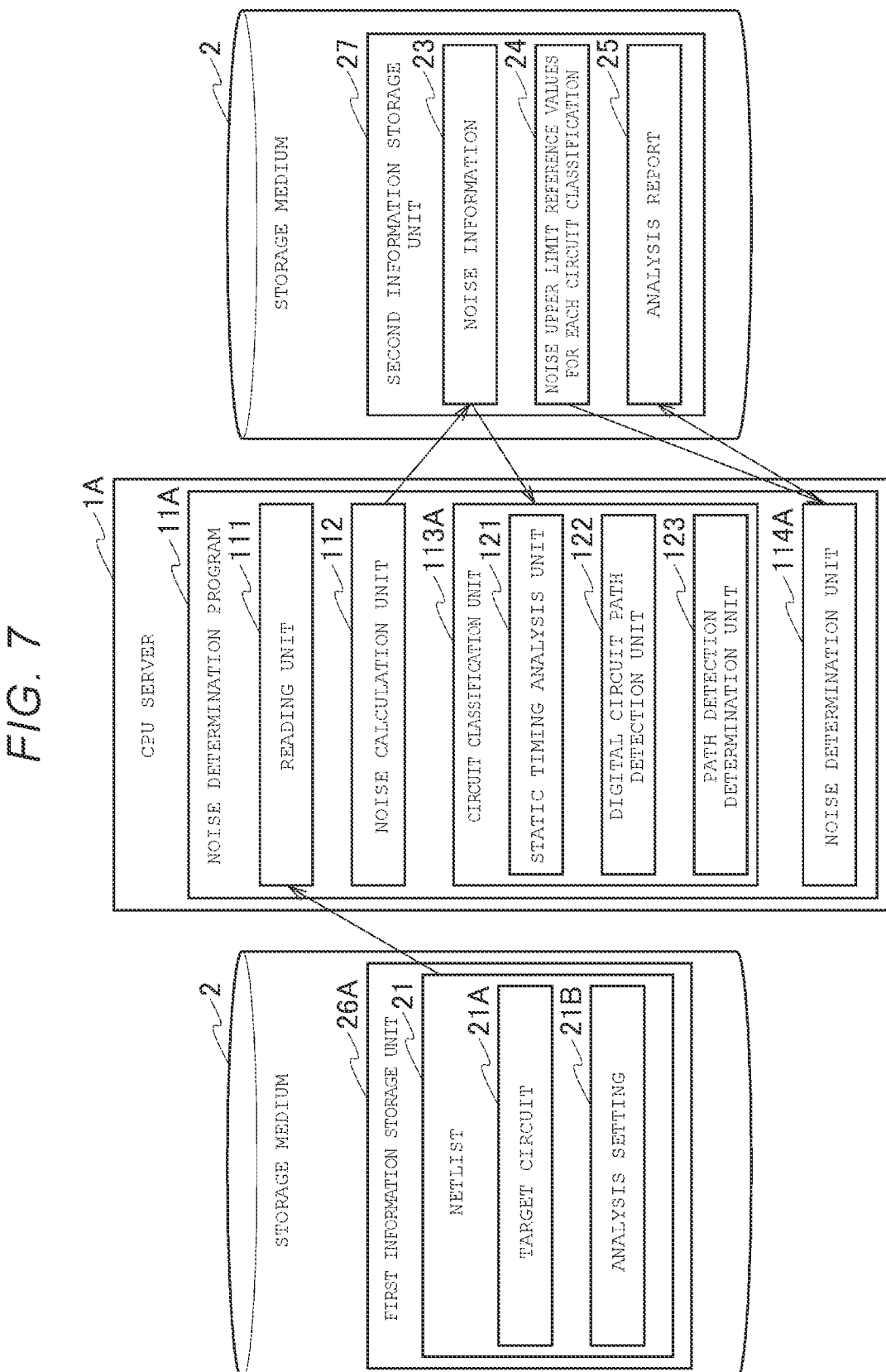
FIG. 7 is a block diagram of a circuit noise determination system according to a second embodiment.

As shown in FIG. 7, the CPU server LA includes a noise determination program 11A that executes a computer program used in the circuit noise determination system 100. The CPU server 1A is another example of the CPU server 1. The noise determination program 11A is another example of the noise determination program 11.

As shown in FIG. 7, the CPU server 1A includes the noise determination program 11A instead of the noise determination program 11. Further, the storage medium 2 includes a first information storage unit 26A instead of the first information storage unit 26. The first information storage unit 26A is another example of the first information storage unit 26. Since other configurations are the same as those of the circuit noise determination system 100 according to the first embodiment, additional description thereof will be omitted.

The noise determination program 11A includes a reading unit 111, a noise calculation unit 112, a circuit classification unit 113A, and a noise determination unit 114A. The noise determination program 11A outputs noise determination result information to the analysis report 25 after executing the noise determination. The first information storage unit 26A includes the netlist 21. Since the reading unit 111 and the noise calculation unit 112 have the same configurations as those of the first embodiment, additional description thereof will be omitted.

The circuit classification unit 113A includes a static timing analysis unit 121, a digital circuit path detection unit 122, and a path detection determination unit 123.

Figure 8A:
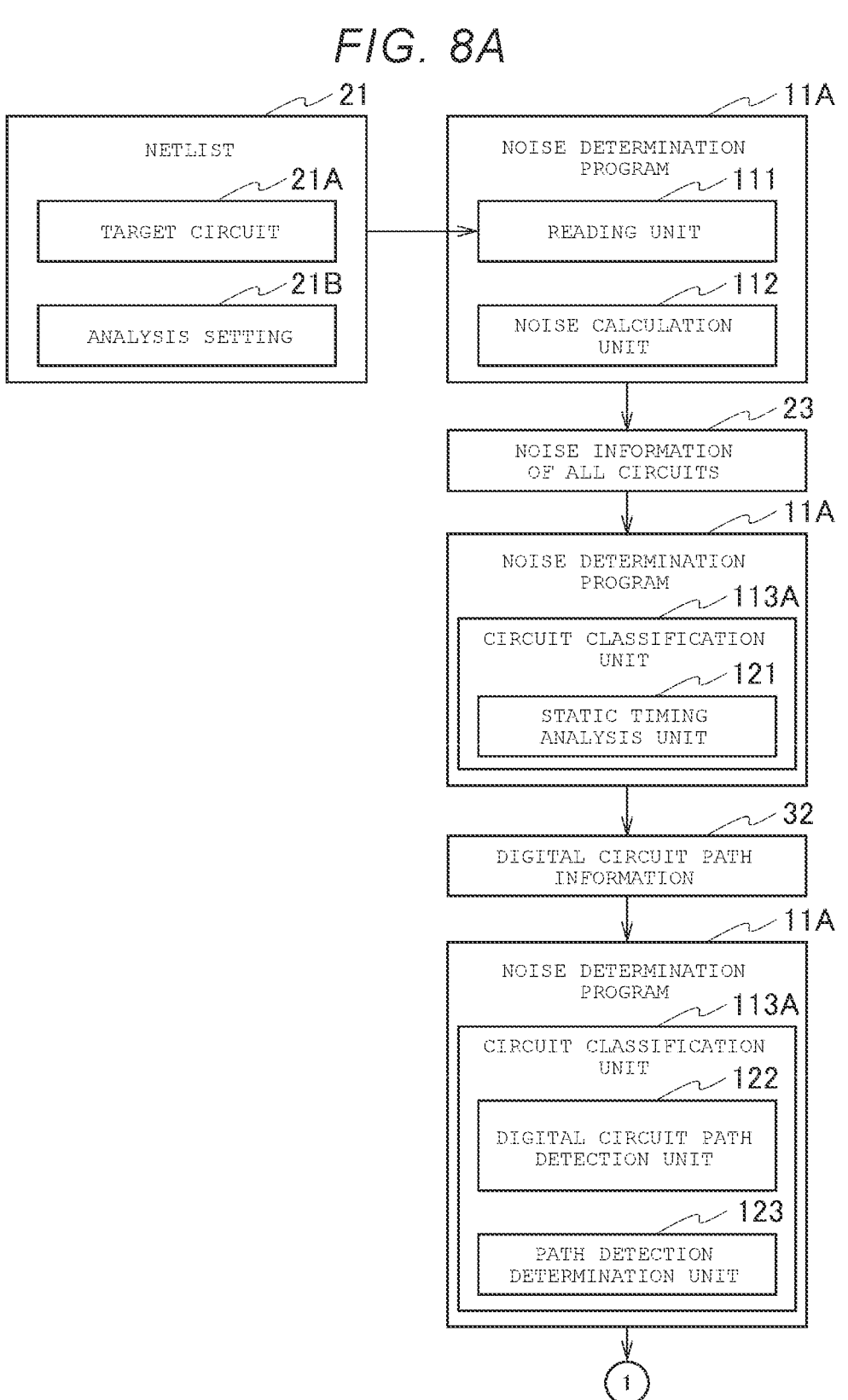

As shown in FIGS. 8A and 8B, the static timing analysis unit 121 detects digital circuit path information by static timing analysis (STA) and outputs the digital circuit path information to the digital circuit path information 32. The static timing analysis unit 121 may read the noise information 23 of all circuits.

The digital circuit path detection unit 122 detects and determines the digital circuit path based on the digital circuit path information 32. The digital circuit path detection unit 122 may output the digital circuit path detection determination result to the path detection determination unit 123.

The path detection determination unit 123 classifies the circuit structure provided in the target circuit 21A as the digital circuit or the analog circuit based on the digital circuit path detection determination result, and outputs the circuit structure to the circuit information 33 for path determination. The circuit information path-determined for each circuit type may be output to the noise determination unit 114A. The circuit classification unit 113A will be further described with reference to FIG. 9.

Based on the noise upper limit reference value 24 for each circuit classification, the noise determination unit 114A outputs the target circuit 21A exceeding the noise upper limit reference value 24 for each circuit classification to the analysis report 25, with respect to the noise value generated by the circuit structure of the path-determined target circuit 21A. The noise determination unit 114A may read the noise upper limit reference value 24 for each circuit classification. The noise determination unit 114A will be further described with reference to FIG. 10.

Figure 9:
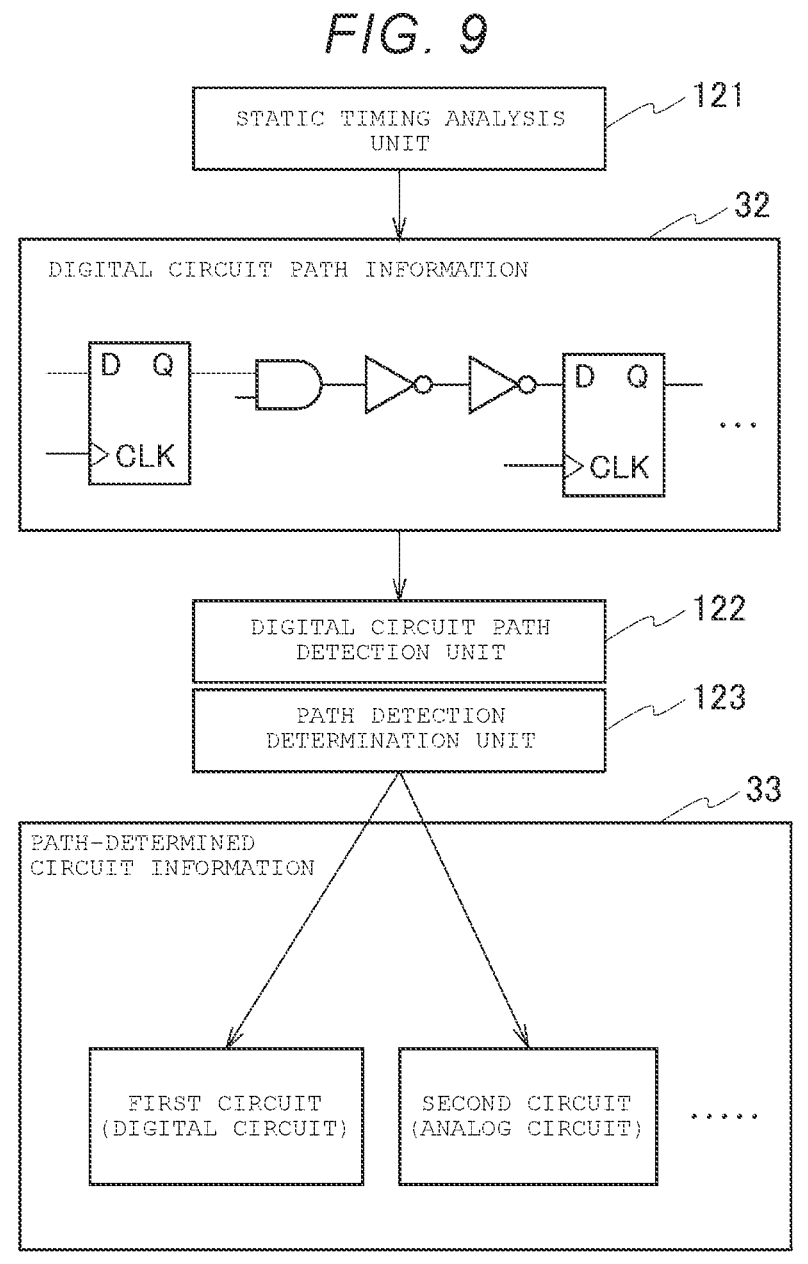

As shown in FIG. 9, the static timing analysis unit 121 performs static timing analysis for the noise information 23 including the circuit structures of the target circuit 21A. The static timing analysis unit 121 may also output the static timing analysis result to the digital circuit path detection unit 122. In the following description, the static timing analysis result is also referred to as digital circuit path information.

The digital circuit path detection unit 122 determines whether there is a digital circuit path for each circuit type in the circuit structure provided in the digital circuit path information. The digital circuit path detection unit 122 also outputs the digital circuit path information 32 including the digital circuit path determination information to the path detection determination unit 123. Specifically, as shown in FIG. 9, the digital circuit path detection unit 122 checks whether there is a digital circuit path for the logic circuit in the digital circuit path information 32.

The path detection determination unit 123 classifies the target circuit 21A as a digital circuit or an analog circuit according to the digital circuit path detection determination result. That is, the path detection determination unit 123 classifies the circuit structure as the digital circuit when a circuit structure having a digital circuit path is detected, and classifies a circuit structure as an analog circuit when a circuit structure having the digital circuit path is not detected. Specifically, as shown in FIG. 9, the path detection determination unit 123 sets the circuit structure determined to have the digital circuit path as a first circuit type (digital circuit), and classifies the circuit structure in the path-determined circuit information 33 accordingly. In addition, the path detection determination unit 123 sets a circuit structure determined not to have the digital circuit path as a second circuit type (analog circuit), and classifies the circuit structure in the path-determined circuit information 33 accordingly.

Figure 10:
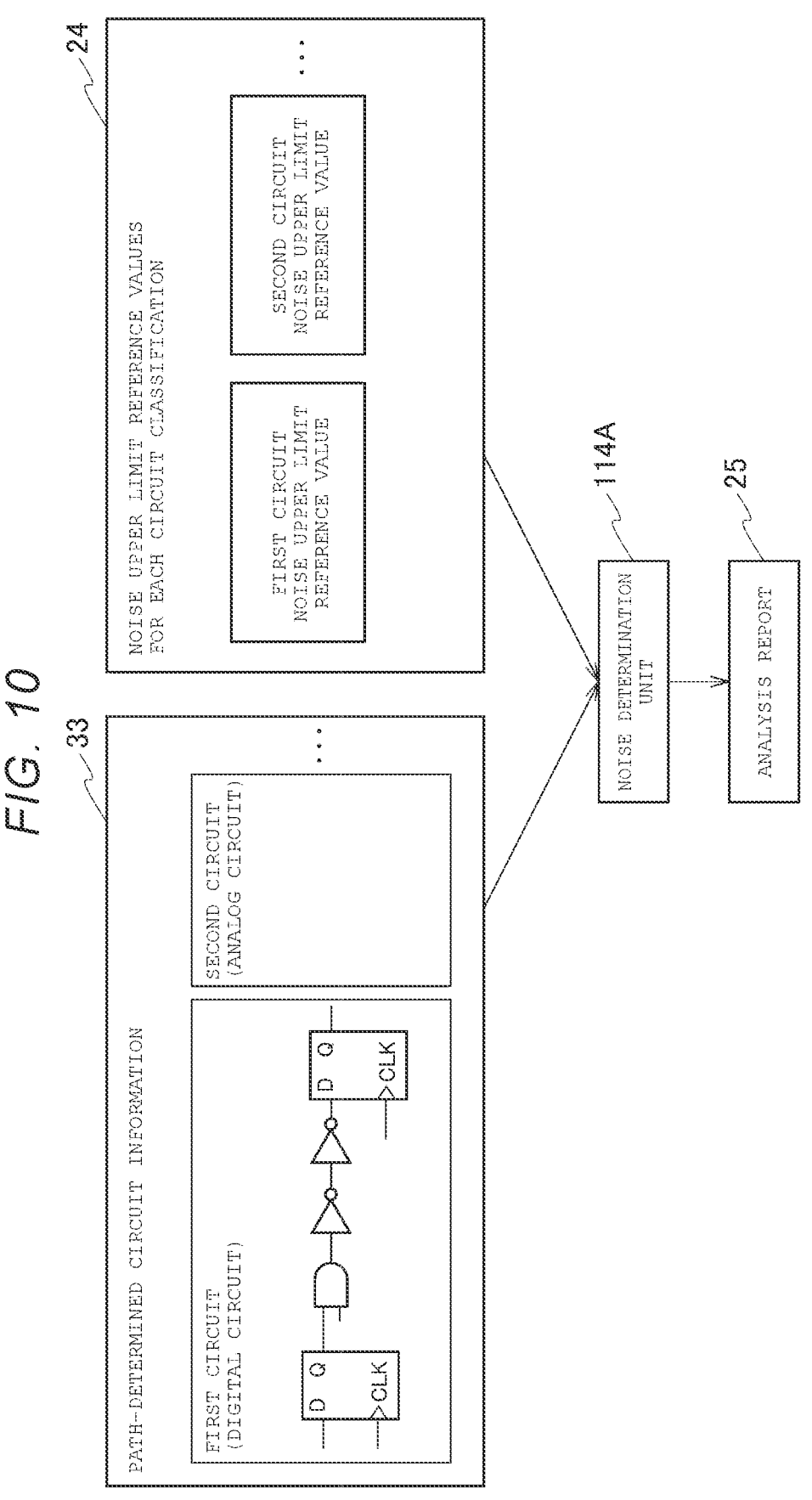
FIG. 10 relates to aspects of a noise determination unit according to a second embodiment.

As shown in FIG. 10, the noise determination unit 114A performs noise determination for each digital circuit and analog circuit. Specifically, as shown in FIG. 10, the noise determination unit 114A reads the noise upper limit reference value 24 for each circuit classification.

Next, the noise determination unit 114A reads the circuit information 33 which is path-determined. Furthermore, the noise determination unit 114A compares the noise value of a digital circuit in the path-determined circuit information 33 (numerical examples of the noise values are omitted in FIG. 10) to the corresponding noise upper limit reference value in the noise upper limit reference value 24 for each circuit classification. The noise determination unit 114A outputs the circuit structure(s) exceeding the noise upper limit reference value to the analysis report 25 based on the noise value comparison result.

(Circuit Noise Determination Method)

Figure 11:
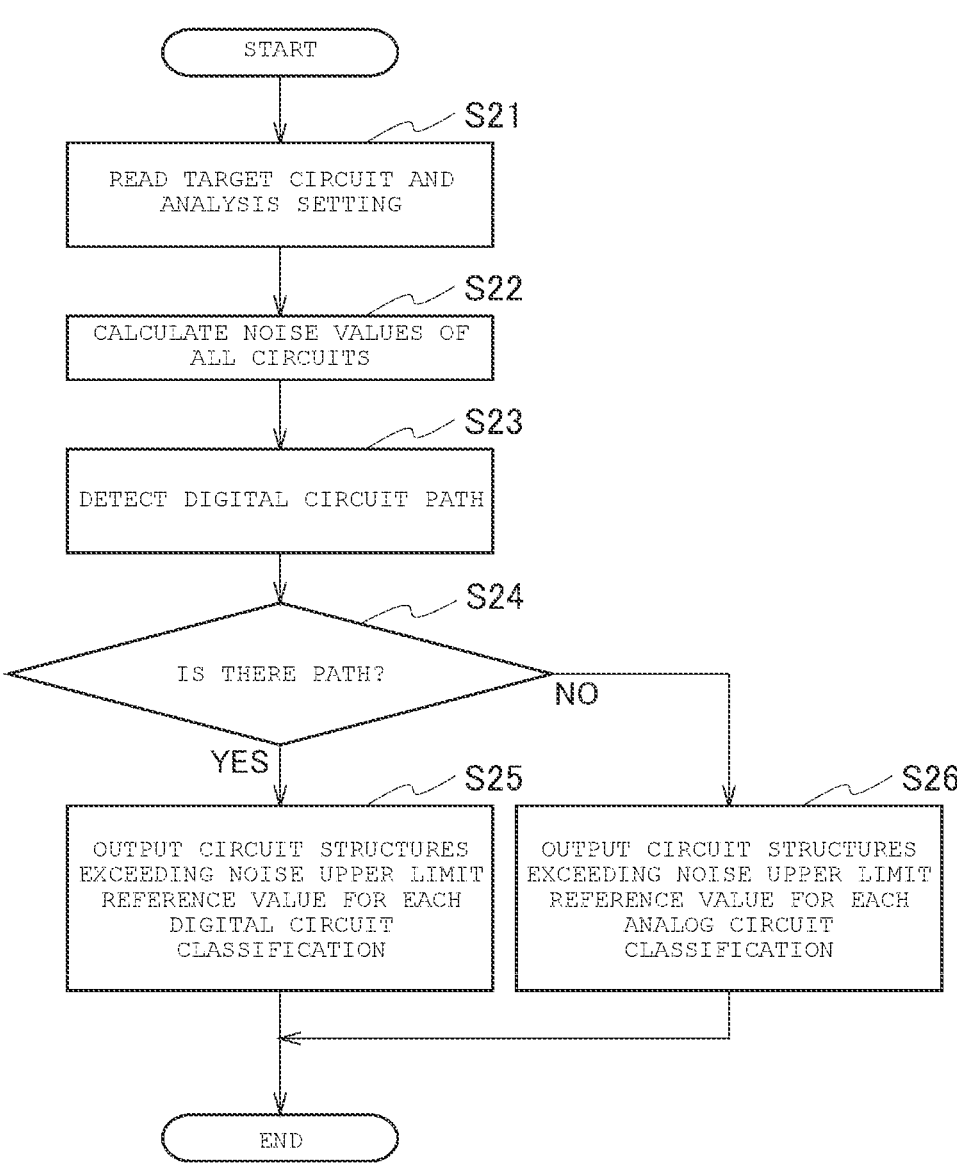
FIG. 11 is an example of a circuit noise determination method according to a second embodiment.

As shown in FIG. 11, first, in step S21, the reading unit 111 reads the netlist 21 (FIG. 7) having the noise analysis target circuit 21A and the analysis setting 21B.

Next, in step S22, the noise calculation unit 112 calculates the noise information 23 (noise values of all circuits) according to the netlist 21.

Next, in step S23, the static timing analysis unit 121 reads the noise information 23 (FIG. 7). Next, the static timing analysis unit 121 detects the digital circuit path information by static timing analysis.

Next, in step S24, the digital circuit path detection unit 122 determines whether there is a digital circuit path in the circuit structures provided in the digital circuit path information 32 for each circuit type.

If the determination is YES in step S24, the processing proceeds to step S25. If the determination is NO, the processing proceeds to step S26.

In step S25, based on the noise upper limit reference value 24 for each circuit classification, the noise determination unit 114A outputs the circuit structure exceeding the noise upper limit reference value to the analysis report 25, with respect to the noise value generated by the digital circuit in the path-determined circuit information 33. Then, after the output, the processing is terminated.

In step S26, based on the noise upper limit reference value 24 for each circuit classification, the noise determination unit 114A outputs the circuit structure exceeding the noise upper limit reference value to the analysis report 25, with respect to the noise value generated by the analog circuit in the path-determined circuit information 33. Then, after the output, the processing is terminated.

Effect of Second Embodiment

As described above, according to the second embodiment, by classifying target circuits into digital circuits and analog circuits, and comparing the noise value for each classified circuit configuration with the noise upper limit reference value for each circuit classification, it is possible to provide a circuit noise determination system capable of detecting minute noise generated in a noise-sensitive circuit while preventing the generation of pseudo errors.

Third Embodiment (Circuit Noise Determination System)

As shown in FIG. 12, the CPU server 1B includes a noise determination program 11B that executes a computer program used in the circuit noise determination system 100. The CPU server 1B is another example of the CPU server 1. The noise determination program 11B is another example of the noise determination program 11.

As shown in FIG. 12, the CPU server 1B includes the noise determination program 11B instead of the noise determination program 11. Further, the storage medium 2 includes a first information storage unit 26B instead of the first information storage unit 26. The first information storage unit 26B is another example of the first information storage unit 26. Further, the first information storage unit 26B may be the same as the first information storage unit 26A. Since other configurations are the same as those of the circuit noise determination system 100 according to the first embodiment, additional description thereof will be omitted.

The noise determination program 11B includes a reading unit 111, a noise calculation unit 112, a circuit classification unit 113B, and a noise determination unit 114B. The noise determination program 11B outputs noise determination result information to the analysis report 25 after executing the noise determination. The first information storage unit 26B includes the netlist 21. Since the reading unit 111 and the noise calculation unit 112 have the same functions as those of the first embodiment, description thereof is omitted.

The circuit classification unit 113B includes a circuit hierarchy detection unit 124, a logic extraction unit 125, and a logic extraction determination unit 126.

Figure 13A:
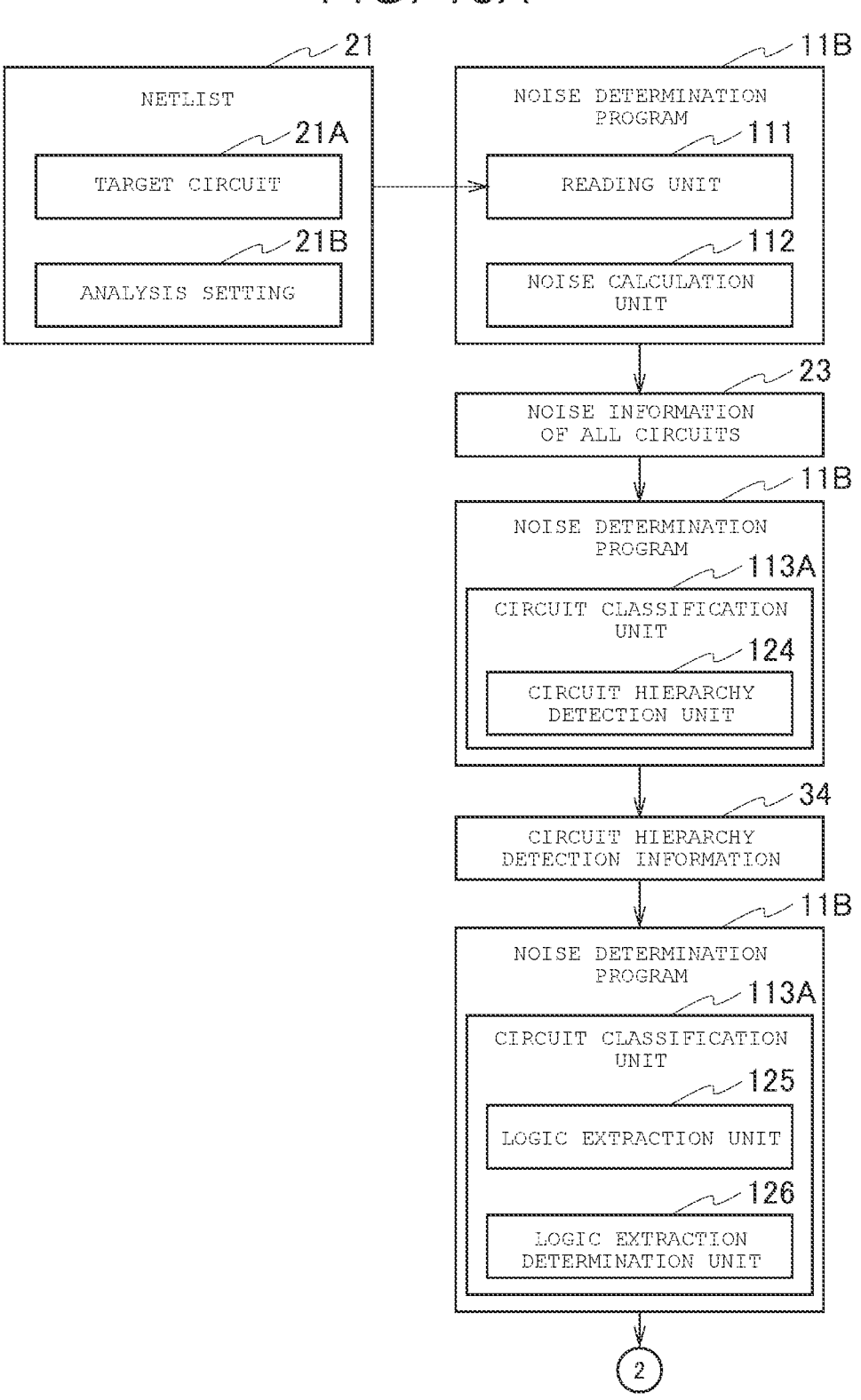
FIGS. 13A and 13B depict relationships between blocks and data in a circuit noise determination system according to a third embodiment.
Figure 13B:
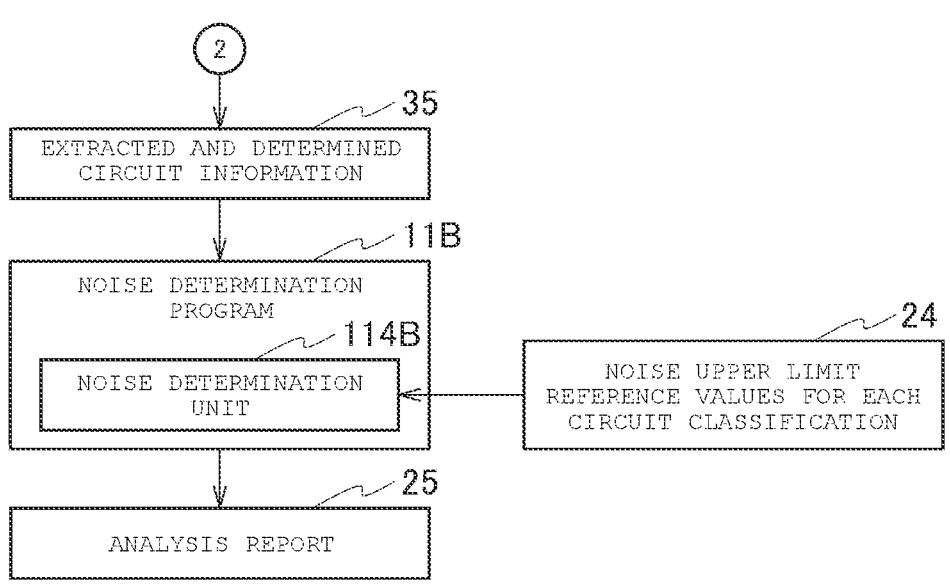

As shown in FIGS. 13A and 13B, the circuit hierarchy detection unit 124 detects a circuit hierarchy for the circuit structures of the target circuit 21A and outputs the circuit hierarchy to the circuit hierarchy information 34. The circuit hierarchy detection unit 124 may read, for example, the noise information 23. Further, the circuit hierarchy detection unit 124 may output a result of detecting the circuit hierarchy to the logic extraction unit 125. In the following description, the result of detecting the circuit hierarchy is also referred to as circuit hierarchy detection information.

Based on the circuit hierarchy information 34, the logic extraction unit 125 extracts the logic of the circuit of which the hierarchy was detected, and outputs the logic to the logic extraction information 36. The logic extraction unit 125 may output the extracted result to the logic extraction determination unit 126.

The logic extraction determination unit 126 determines whether the logic extraction unit 125 extracted the logic based on the extracted result. Further, the logic extraction determination unit 126 classifies the target circuit 21A as the digital circuit or the analog circuit according to the result of the logic extraction determination, and outputs the result to the extracted and determined circuit information 35. The circuit information extracted and determined for each circuit type may be output to the noise determination unit 114B. The circuit classification unit 113B will be further described with reference to FIG. 14.

Based on the noise upper limit reference value 24 for each circuit classification, the noise determination unit 114B outputs the extracted target circuit 21A exceeding the noise upper limit reference value 24 for each circuit classification to the analysis report 25, with respect to the noise value generated by the circuit structure of the extracted and determined target circuit 21A. The noise determination unit 114B may read the noise upper limit reference value 24 for each circuit classification. The noise determination unit 114B will be further described with reference to FIG. 15.

Figure 14:
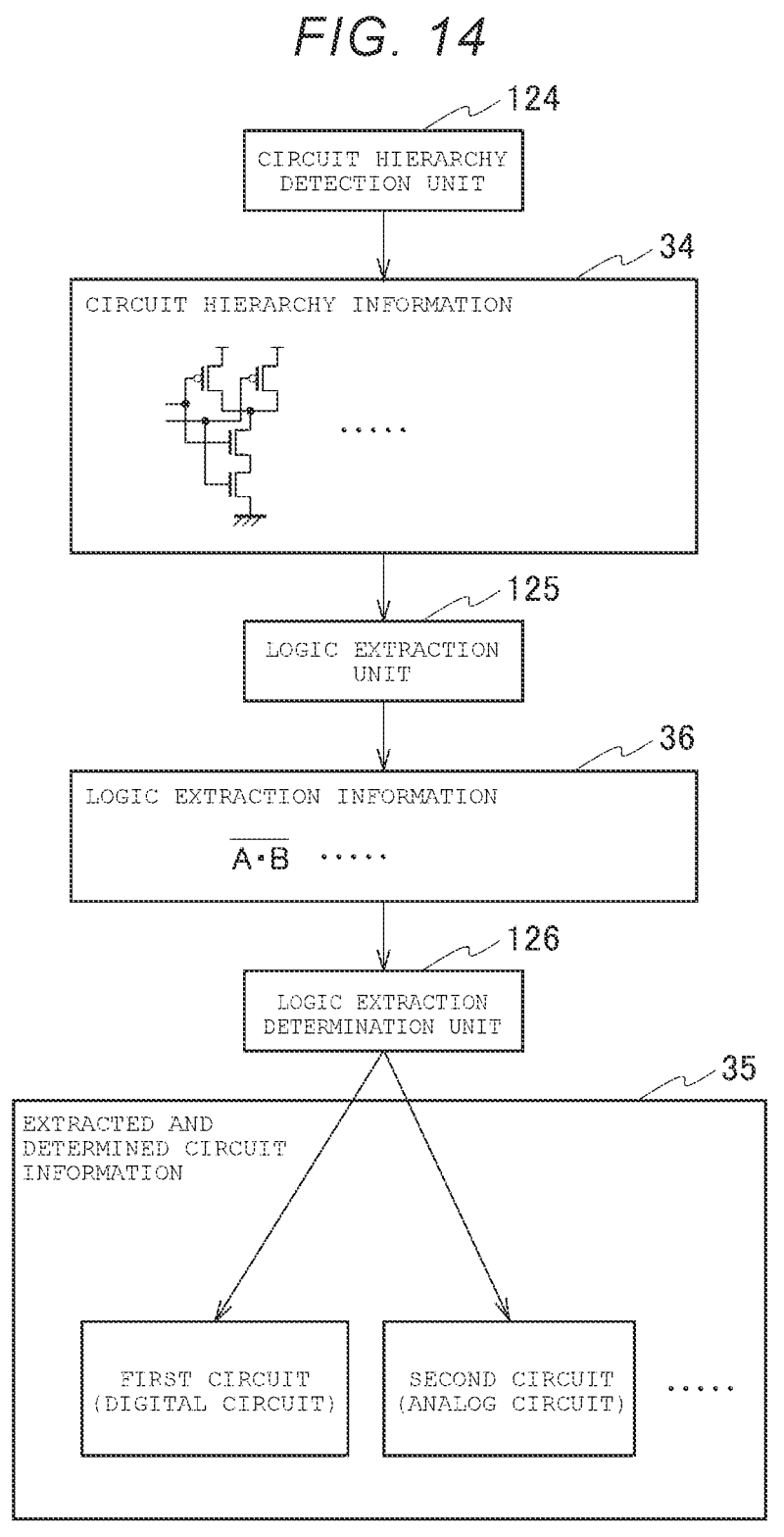

As shown in FIG. 14, the circuit hierarchy detection unit 124 extracts the logic circuit hierarchy from the noise information 23 for the circuit structures of the target circuit 21A. Specifically, as shown in FIG. 14, the circuit hierarchy detection unit 124 extracts a 2-input NAND circuit as the circuit hierarchy information 34 from the noise information 23.

The logic extraction unit 125 performs logic extraction based on the extraction result of the hierarchy. Specifically, as shown in FIG. 14, the logic extraction unit 125 extracts/ A·B (logical expression of NAND) as the logic extraction information from the 2-input NAND circuit of the extraction result of the hierarchy.

The logic extraction determination unit 126 classifies the target circuit 21A as the digital circuit or the analog circuit according to the logic extraction information. That is, when logic extraction is possible, the logic extraction determination unit 126 determines that the target circuit 21A is a digital circuit, and when logic extraction is not possible, determines that the target circuit 21A is an analog circuit and classifies the target circuit 21A accordingly. Specifically, as shown in FIG. 14, the logic extraction determination unit 126 determines that logic extraction is possible at/AB (logical expression of NAND) in the logic extraction information, and classifies the target circuit 21A as the first circuit type (digital circuit). If the logic extraction determination unit 126 determines that logic extraction is not possible for the logic extraction information for the target circuit 21A, the target circuit 21A would be classified as the second circuit type (analog circuit).

Figure 15:
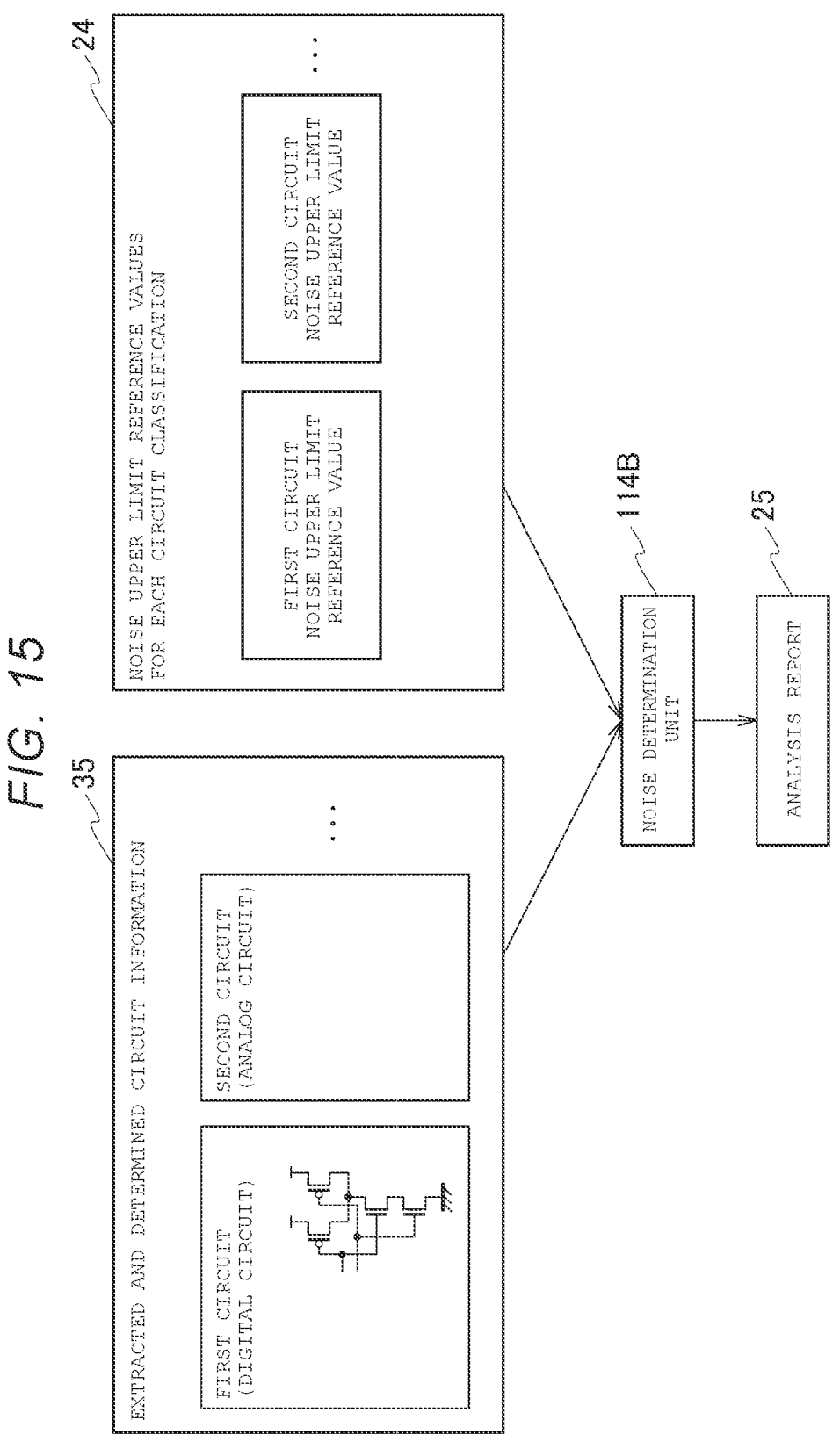
FIG. 15 relates to aspects of a noise determination unit according to a third embodiment.

As shown in FIG. 15, the noise determination unit 114B performs noise determination for each digital circuit and analog circuit. Specifically, as shown in FIG. 15, the noise determination unit 114B reads noise upper limit reference value 24 for each circuit classification.

Next, the noise determination unit 114B reads the extracted and determined circuit information 35. Furthermore, the noise determination unit 114B compares the noise value of a digital circuit in the extracted and determined circuit information 35 (numerical examples of the noise value are omitted in FIG. 15) with the corresponding noise upper limit reference value in the noise upper limit reference value 24 for each circuit classification (note, numerical examples of the noise value are omitted in FIG. 15). The noise determination unit 114B outputs the circuit structure(s) exceeding the noise upper limit reference value to the analysis report 25 based on the noise value comparison result.

(Circuit Noise Determination Method)

Figure 16:
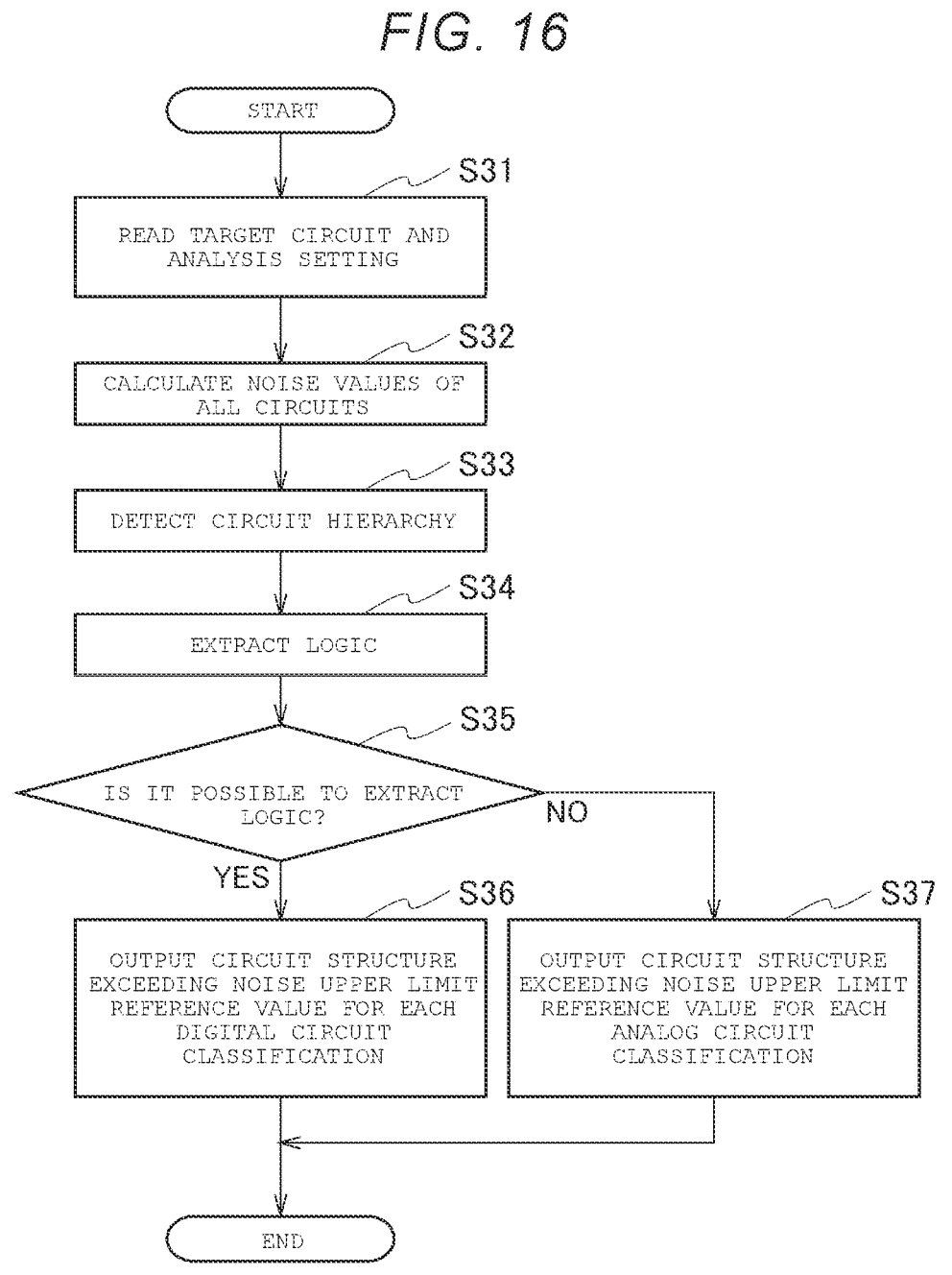

As shown in FIG. 16, first, in step S31, the reading unit 111 reads the netlist 21 (FIG. 12) having the noise analysis target circuit 21A and the analysis setting 21B.

Next, in step S32, the noise calculation unit 112 calculates the noise information 23 for all circuit components/elements according to the netlist 21.

Next, in step S33, the circuit hierarchy detection unit 124 reads the noise information 23 (FIG. 12). Next, the circuit hierarchy detection unit 124 detects the circuit hierarchy based on the circuit structures in the noise information 23.

In step S34, the logic extraction unit 125 extracts logic based on the hierarchy extraction result.

If it is possible to extract logic, the determination is YES in step S35, and the processing proceeds to step S36. If the determination is NO, the processing proceeds to step S37.

In step S36, based on the noise upper limit reference value 24 for each circuit classification, the noise determination unit 114B outputs the circuit structure exceeding the noise upper limit reference value to the analysis report 25, with respect to the noise value generated by the digital circuit in the extracted and determined circuit information 35. Then, after the output, the processing is terminated.

In step S36, based on the noise upper limit reference value 24 for each circuit classification, the noise determination unit 114B outputs the circuit structure exceeding the noise upper limit reference value to the analysis report 25, with respect to the noise value generated by the analog circuit in the extracted and determined circuit information 35. Then, after the output, the processing is terminated.

Effect of Third Embodiment

As described above, according to the third embodiment, by classifying target circuits into digital circuits and analog circuits, and comparing the noise value for each classified circuit configuration with the noise upper limit reference value for each circuit classification, it is possible to provide a circuit noise determination system capable of detecting minute noise generated in a noise-sensitive circuit while preventing the generation of pseudo errors.

Fourth Embodiment (Circuit Noise Determination System)

As shown in FIG. 17, the CPU server 1C includes a noise determination program 11C that executes computer programs used in the circuit noise determination system 100. The CPU server 1C is another example of the CPU server 1. The noise determination program 11C is another example of the noise determination program 11.

As shown in FIG. 17, the CPU server 1C includes the noise determination program 11C instead of the noise determination program 11. Further, the storage medium 2 includes a first information storage unit 26C instead of the first information storage unit 26. The first information storage unit 26C includes a netlist 21 and a circuit library 22. As shown in FIG. 17, the circuit library 22 has a labeled circuit information 22B. The first information storage unit 26C is another example of the first information storage unit 26. Since other configurations have the same functions as those of the circuit noise determination system 100 according to the first embodiment, additional description thereof will be omitted.

The labeled circuit information 22B has circuit structure information labeled as digital circuits and analog circuits in advance for each circuit type. The labeled circuit information 22B has label information indicating a digital circuit or an analog circuit for each circuit information entry. Here, in the labeled circuit information 22B, the circuit information for each circuit type is registered with the label of the digital circuit or the analog circuit. The labeled circuit information 22B is a transistor-based circuit, and the minimum unit of the circuit structure to be registered is a transistor.

The noise determination program 11C includes a reading unit 111, a noise calculation unit 112, a circuit classification unit 113C, and a noise determination unit 114. The noise determination program 11C outputs noise determination result information to the analysis report 25 after executing the noise determination. Since the reading unit 111, the noise calculation unit 112, and the noise determination unit 114 have the same functions as those of the circuit noise determination system 100 according to the first embodiment, additional description thereof will be omitted.

The circuit classification unit 113C includes a first circuit learning unit 127.

Figure 18A:
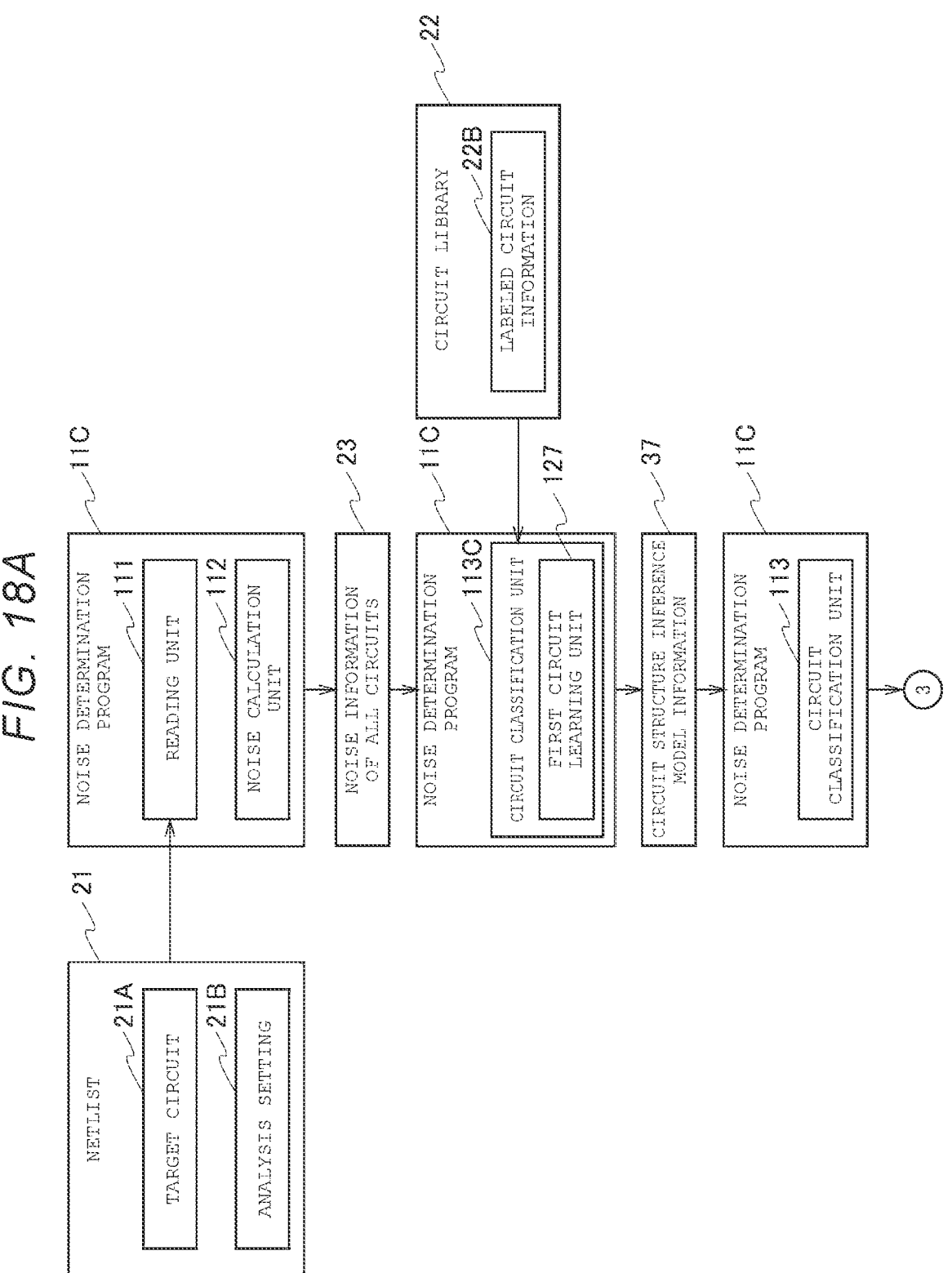
FIGS. 18A and 18B depict relationships between blocks and data in a circuit noise determination system according to a fourth embodiment.
Figure 18B:
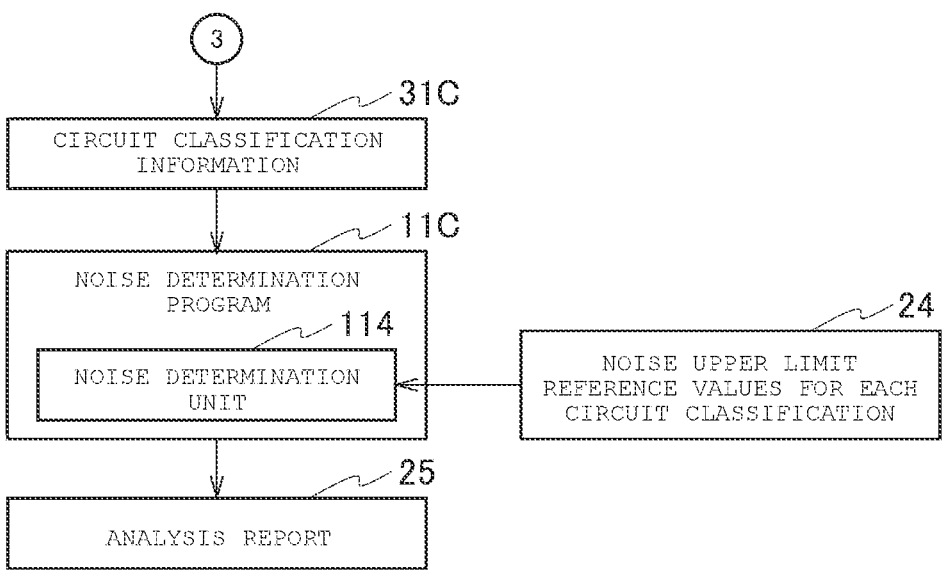

As shown in FIGS. 18A and 18B, the first circuit learning unit 127 learns the circuit structure from the circuit library 22 having labeled circuit information 22B. The first circuit learning unit 127 outputs learned circuit structure inference model information to the circuit structure inference model information 37. The first circuit learning unit 127 may output the learned circuit structure inference model information to the circuit classification unit 113C.

The circuit classification unit 113C classifies the target circuit 21A by a circuit inference processing using the circuit structure inference model information based on the circuit library 22. That is, the circuit classification unit 113C classifies the circuit structures provided in the target circuit 21A for each circuit type, and outputs the circuit classification information to the circuit classification information 31C. For example, the circuit classification unit 113C may read the circuit library 22 having the labeled circuit information 22B and the noise information 23 of all circuits. The circuit classification unit 113C may output the circuit classification information to the noise determination unit 114.

Details of the circuit classification unit 113C will be described with reference to FIG. 19. In the following description, classifying for each circuit type using the circuit structure inference model information 37 is also called the circuit inference processing.

Figure 19:
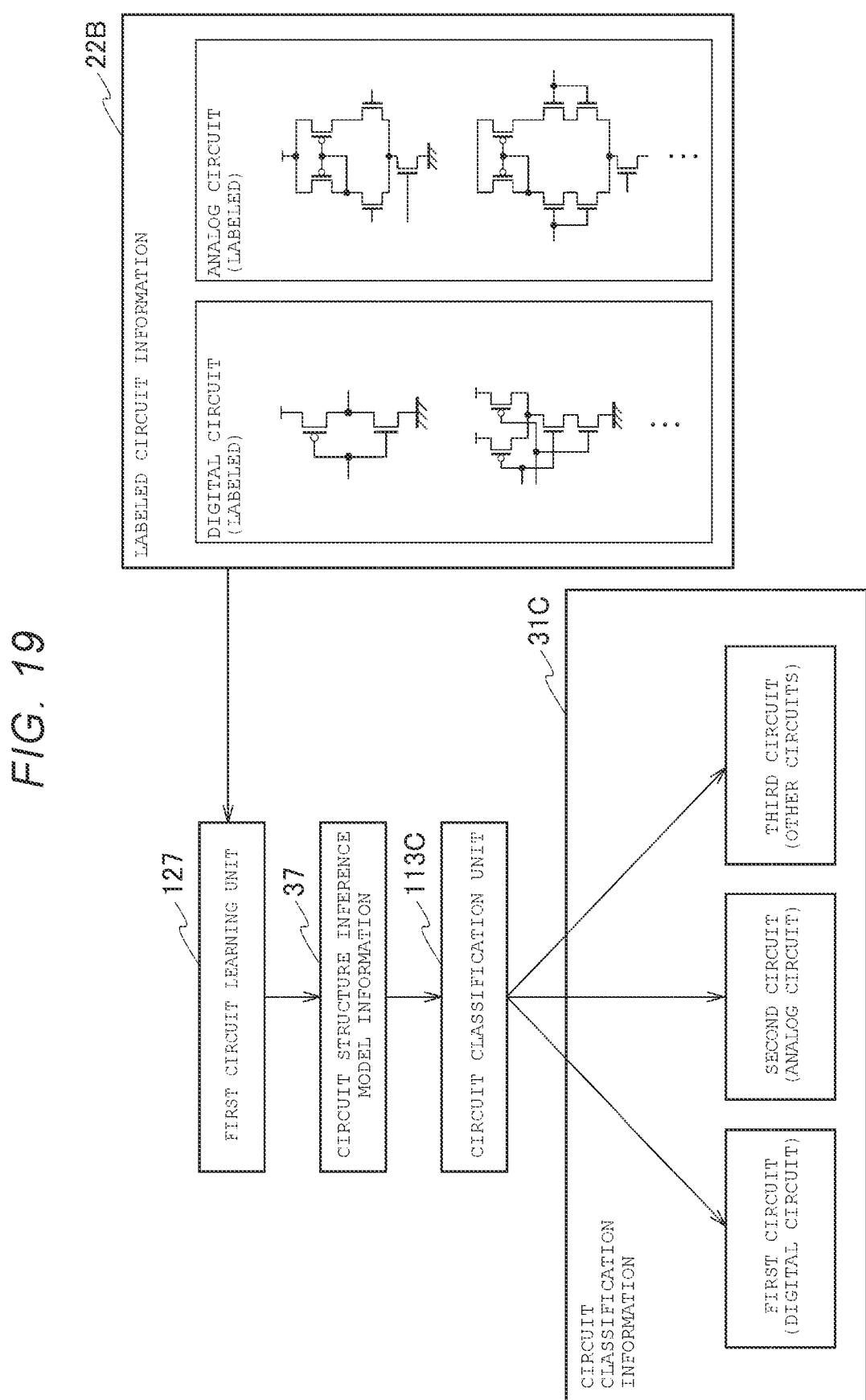
FIG. 19 relates to aspects of a circuit classification unit according to a fourth embodiment.

As shown in FIG. 19, the first circuit learning unit 127 generates circuit structure inference model information through learning based on the labeled circuit information 22B. Specifically, the first circuit learning unit 127 reads the circuit structures of digital circuits and analog circuits provided in the labeled circuit information 22B, which is prepared in advance.

Next, the first circuit learning unit 127 learns the circuit structures of the digital circuits and the analog circuits based on the labeled circuit information 22B. The first circuit learning unit 127 outputs the learning result to the circuit structure inference model information 37.

The circuit classification unit 113C reads the noise information 23 and the circuit structure inference model information 37 of all circuits. The circuit classification unit 113C collates the circuit structures of the target circuit 21A in the noise information 23 with the circuit structures provided in the circuit structure inference model information 37, detects a matching circuit structure, and classifies the circuit structures of the target circuit 21A by type accordingly.

As shown in FIG. 19, the circuit classification unit 113C collates the digital circuits in the noise information 23 with the digital circuits in the circuit structure inference model information 37, detects a digital circuit as a matching circuit structure, sets the circuit as a first circuit type (digital circuit), and classifies the digital circuit in the circuit classification information 31 accordingly. Similarly, the circuit classification unit 113C collates the analog circuit in the noise information 23 of all circuits with the analog circuits in the circuit structure inference model information 37, detects an analog circuit as the matching circuit structure, sets the analog circuit as a second circuit type (analog circuit), and classifies the analog circuit in the circuit classification information 31. If the circuit structure is not in the circuit structure inference model information 37 or if the circuit structure is an analog circuit that is resistant to noise, the circuit classification unit 113C may detect the circuit structure as a third circuit type (other circuits) and classify the circuit structure in the circuit classification information 31 accordingly.

(Circuit Noise Determination Method)

As shown in FIG. 20, first, in step S41, the reading unit 111 reads the netlist 21 (FIG. 17) having the noise analysis target circuit 21A and the analysis setting 21B.

Next, in step S42, the noise calculation unit 112 calculates the noise value of all circuits according to the netlist 21.

In step S43, the first circuit learning unit 127 learns the circuit structures based on the circuit library 22 (FIG. 17) having the labeled circuit information 22B. Specifically, the first circuit learning unit 127 learns the various circuit structures from the labeled circuit information 22B.

In step S44, the circuit classification unit 113 detects and classifies (identifies) the digital circuits and the analog circuits provided in the target circuit 21A by circuit inference processing.

Next, in step S45, based on the noise upper limit reference value for a plurality of noise determinations prepared for each circuit classification, the noise determination unit 114 outputs the circuit structure exceeding the noise upper limit reference value to the analysis report 25, with respect to the noise value generated by the circuit structure of the target circuit 21A provided in the circuit classification information 31C. Then, after the output, the processing is terminated.

Effect of Fourth Embodiment

As described above, according to the fourth embodiment, by classifying target circuits into digital circuits and analog circuits and comparing the noise value for each classified circuit configuration with the noise upper limit reference value for each circuit classification, it is possible to provide a circuit noise determination system capable of detecting minute noise generated in a noise-sensitive circuit while preventing the generation of pseudo errors.

Fifth Embodiment (Circuit Noise Determination System)

As shown in FIG. 21, the CPU server 1D includes a noise determination program 11D that executes computer programs used in the circuit noise determination system 100. The CPU server 1D is another example of the CPU server 1. The noise determination program 11D is another example of the noise determination program 11.

As shown in FIG. 21, the CPU server 1D includes the noise determination program 11D instead of the noise determination program 11. Further, the storage medium 2 includes a first information storage unit 26D instead of the first information storage unit 26. The first information storage unit 26D includes the netlist 21 and the circuit library 22. The circuit library 22 has the labeled circuit information 22B. The first information storage unit 26D may be the same as the first information storage unit 26C. The first information storage unit 26D is another example of the first information storage unit 26. Since other configurations have functions similar to those of the circuit noise determination system 100 according to the first embodiment, additional description thereof will be omitted.

The noise determination program 11D includes the reading unit 111, the noise calculation unit 112, the circuit classification unit 113D, and the noise determination unit 114. The noise determination program 11D outputs the noise determination result information to the analysis report 25 after executing the noise determination. Since the reading unit 111, the noise calculation unit 112, and the noise determination unit 114 have the same functions as those of the circuit noise determination system 100 according to the first embodiment, additional description thereof will be omitted.

The circuit classification unit 113D includes a first circuit learning unit 127D. The first circuit learning unit 127D includes a binary decision graph generation unit 128.

Figure 22A:
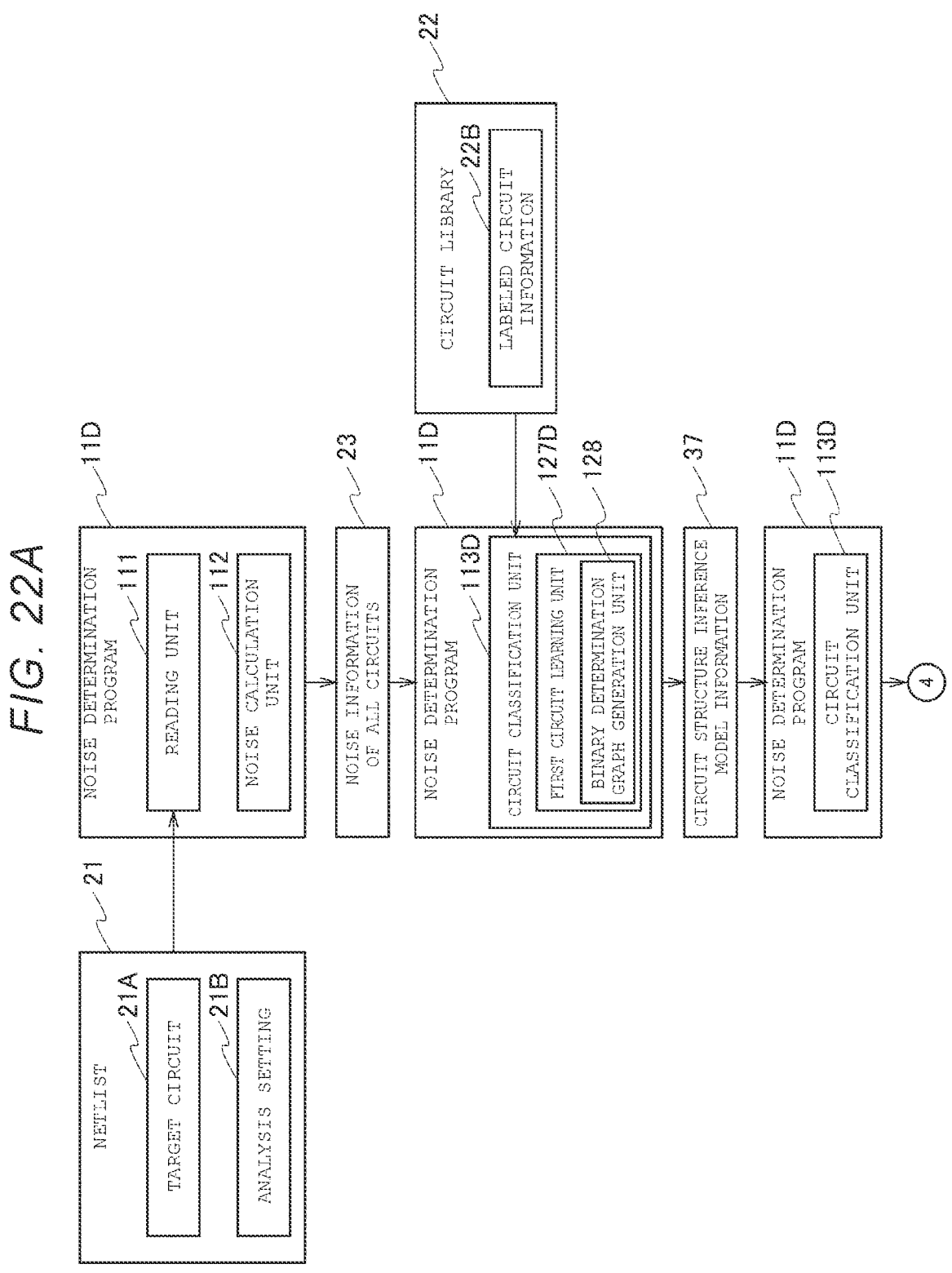
FIGS. 22A and 22B depict relationships between blocks and data in a circuit noise determination system according to a fifth embodiment.
Figure 22B:
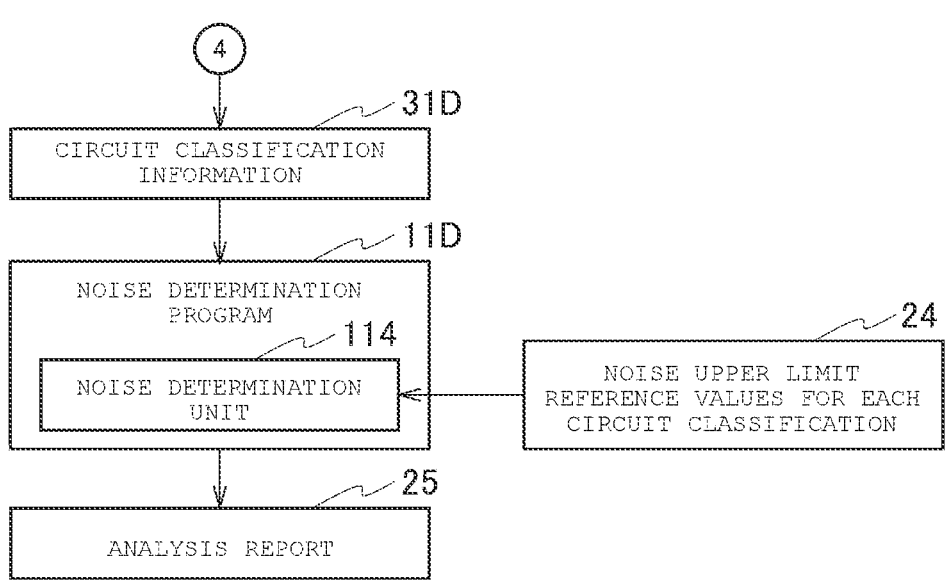

As shown in FIGS. 22A and 22B, the binary decision graph generation unit 128 generates circuit information of a binary decision graph (binary decision diagram: BDD) from the circuit library 22 having the labeled circuit information 22B. In addition, the binary decision graph generation unit 128 outputs the generation result to the first circuit learning unit 127D.

The first circuit learning unit 127D learns a circuit structure from a circuit structure expressed in a binary decision graph (BDD) format. The first circuit learning unit 127D outputs the learning result to the circuit structure inference model information 37. The first circuit learning unit 127D may output the learning result to the circuit classification unit 113D.

The circuit classification unit 113D classifies the target circuit 21A by circuit inference processing based on the circuit structure inference model information 37. That is, the circuit classification unit 113D classifies the circuit structures provided in the target circuit 21A for each circuit type, and outputs the classified circuit information to the circuit classification information 31D. For example, the circuit classification unit 113D may read the circuit library 22 having the labeled circuit information 22B and the noise information 23 of all circuits. The circuit classification unit 113D may output the circuit classification information to the noise determination unit 114. Details of the circuit classification unit 113D will be described with reference to FIG. 23.

Figure 23:
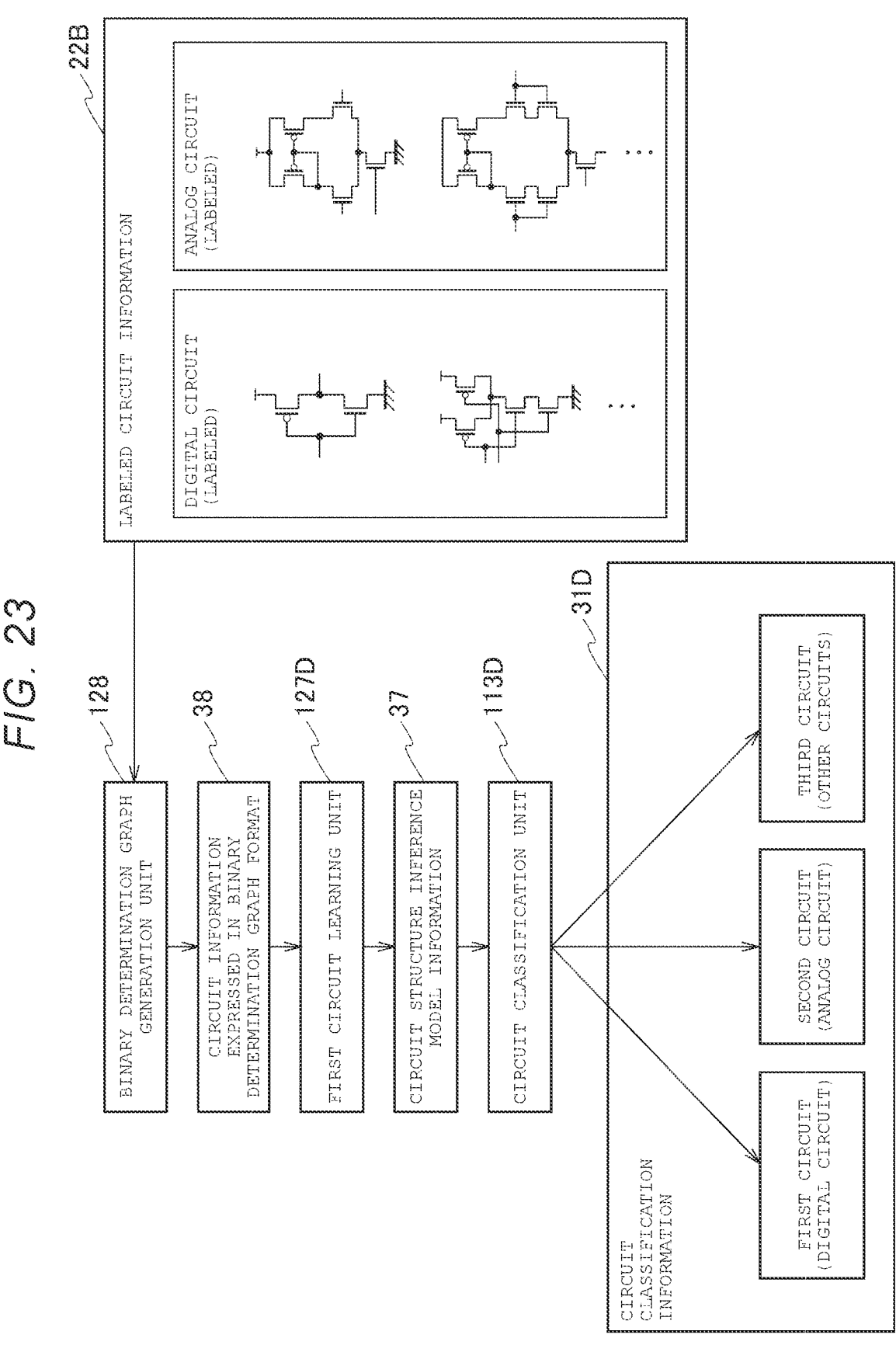
FIG. 23 relates to aspects of a circuit classification unit according to a fifth embodiment.

As shown in FIG. 23, the binary decision graph generation unit 128 generates the circuit structure of the binary decision graph (BDD) based on the circuit library 22 having labeled circuit information 22B. Specifically, the binary decision graph generation unit 128 generates the circuit structure converted into a binary decision graph from the connection information of the transistors based on the circuit structure of the labeled circuit information 22B. The binary decision graph generation unit 128 may output the generation result to the circuit information 38 in a binary decision graph format.

The first circuit learning unit 127D learns based on the circuit information 38 expressed in the binary decision graph format. Specifically, the first circuit learning unit 127D reads the circuit information 38 expressed in the binary decision graph format, and learns the circuit structures of the digital circuits and the analog circuits. The first circuit learning unit 127D outputs the learning result to the circuit structure inference model information 37.

The circuit classification unit 113D reads the noise information 23 and the circuit structure inference model information 37 of all circuits. The circuit classification unit 113D classifies circuit structures by circuit inference processing.

(Circuit Noise Determination Method)

As shown in FIG. 24, first, in step S51, the reading unit 111 reads the netlist 21 (FIG. 21) having the noise analysis target circuit 21A and the analysis setting 21B.

In step S52, the noise calculation unit 112 calculates the noise values of all circuits according to the netlist 21.

In step S53, the binary decision graph generation unit 128 generates circuit information expressed in the binary decision graph (BDD) format based on the circuit library 22 (FIG. 17).

In step S54, the first circuit learning unit 127D learns the circuit structure inference model information based on the circuit information 38 expressed in the binary decision graph format.

In step S55, the circuit classification unit 113D detects and classifies the digital circuits and the analog circuits in the target circuit 21A by circuit inference processing.

Next, in step S56, based on the noise upper limit reference values for a plurality of noise determinations prepared for each circuit classification, the noise determination unit 114 outputs the circuit structure exceeding the noise upper limit reference value to the analysis report 25, with respect to the noise value generated by the circuit structure of the target circuit 21A provided in the circuit classification information 31D. Then, after the output, the processing is terminated.

Effect of Fifth Embodiment

As described above, according to the fifth embodiment, by classifying target circuits into digital circuits and analog circuits and comparing the noise value for each classified circuit configuration with the noise upper limit reference value for each circuit classification, it is possible to provide a circuit noise determination system capable of detecting minute noise generated in a noise-sensitive circuit while preventing the generation of pseudo errors.

Sixth Embodiment (Circuit Noise Determination System)

Figure 25:
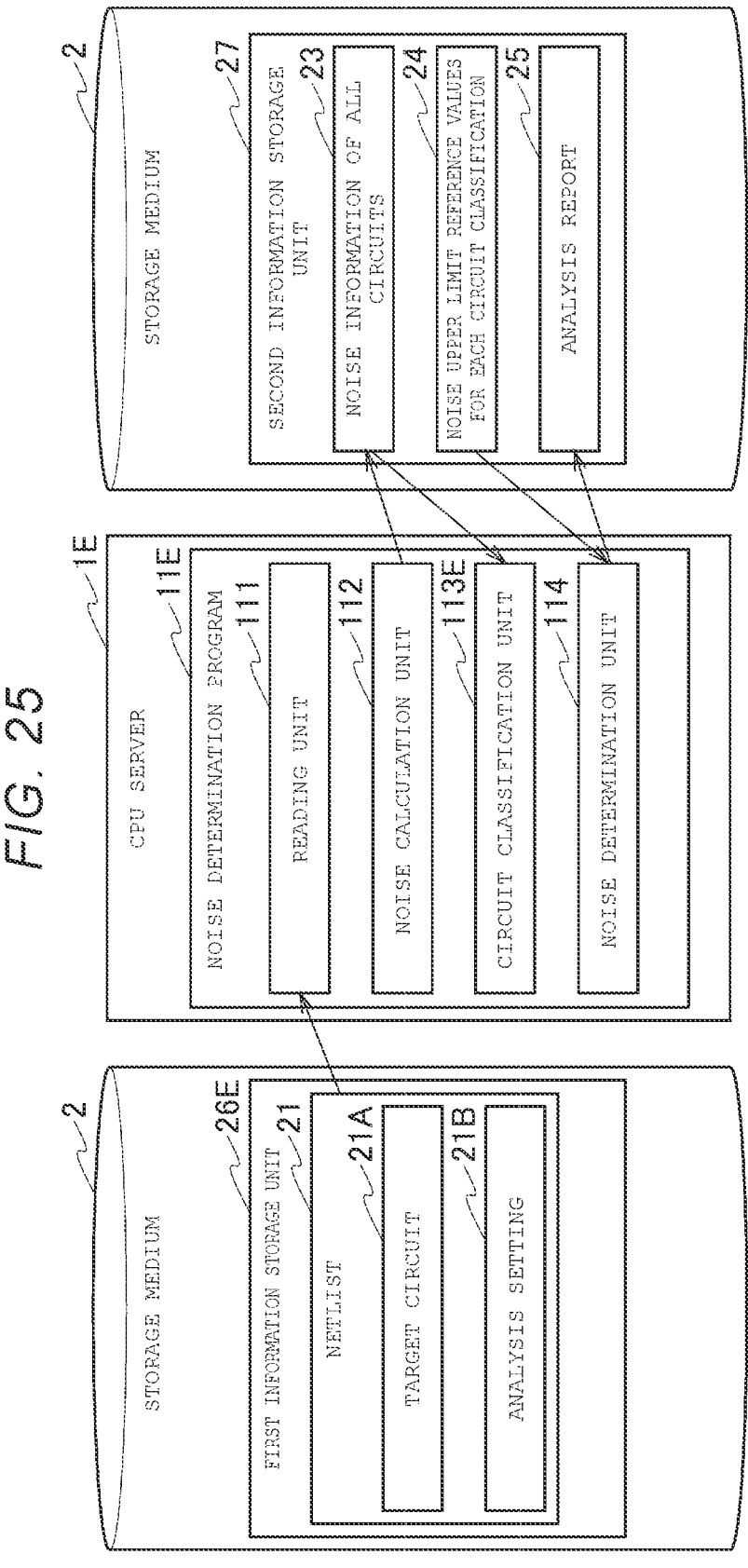
FIG. 25 is a block diagram of a circuit noise determination system according to a sixth embodiment.

As shown in FIG. 25, a CPU server 1E includes a noise determination program 11E that executes computer programs used in the circuit noise determination system 100. The CPU server 1E is another example of the CPU server 1. The noise determination program 11E is another example of the noise determination program 11.

As shown in FIG. 25, the CPU server 1E includes a noise determination program 11E instead of the noise determination program 11. The storage medium 2 includes a first information storage unit 26E instead of the first information storage unit 26. The first information storage unit 26E is another example of the first information storage unit 26. The first information storage unit 26E may be the same as the first information storage unit 26. Since other configurations have the same functions as those of the circuit noise determination system 100 according to the first embodiment, additional description thereof will be omitted.

The noise determination program 11E includes the reading unit 111, the noise calculation unit 112, a circuit classification unit 113E, and the noise determination unit 114. The noise determination program 11E outputs the noise determination result information to the analysis report 25 after executing the noise determination. The first information storage unit 26E includes the netlist 21. Since the reading unit 111, the noise calculation unit 112, and the noise determination unit 114 have the same functions as those of the first embodiment, description thereof is omitted.

Figure 26:
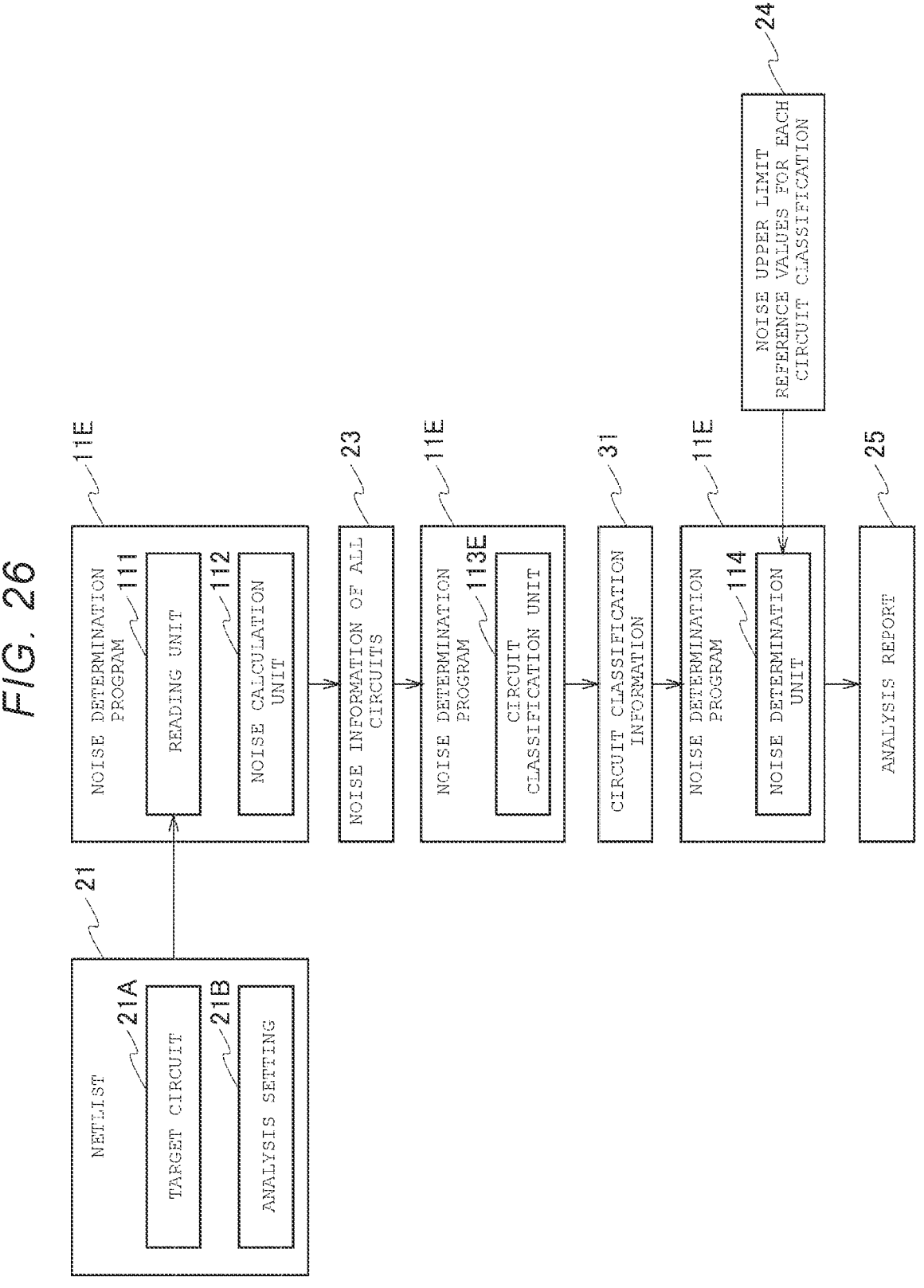
FIG. 26 depicts relationships between blocks and data in a circuit noise determination system according to a sixth embodiment.

As shown in FIG. 26, the circuit classification unit 113E detects and classifies the digital circuits and the analog circuits provided in the target circuit 21A based on a node name naming rule of the netlist. Further, the circuit classification unit 113E classifies the circuit structures provided in the target circuit 21A for each circuit type, and outputs the classified circuit information to the circuit classification information 31. For example, the circuit classification unit 113E may read the noise information 23. Further, the circuit classification unit 113E may output the circuit classification information to the noise determination unit 114. Details of the circuit classification unit 113E will be described with reference to FIG. 27.

Figure 27:
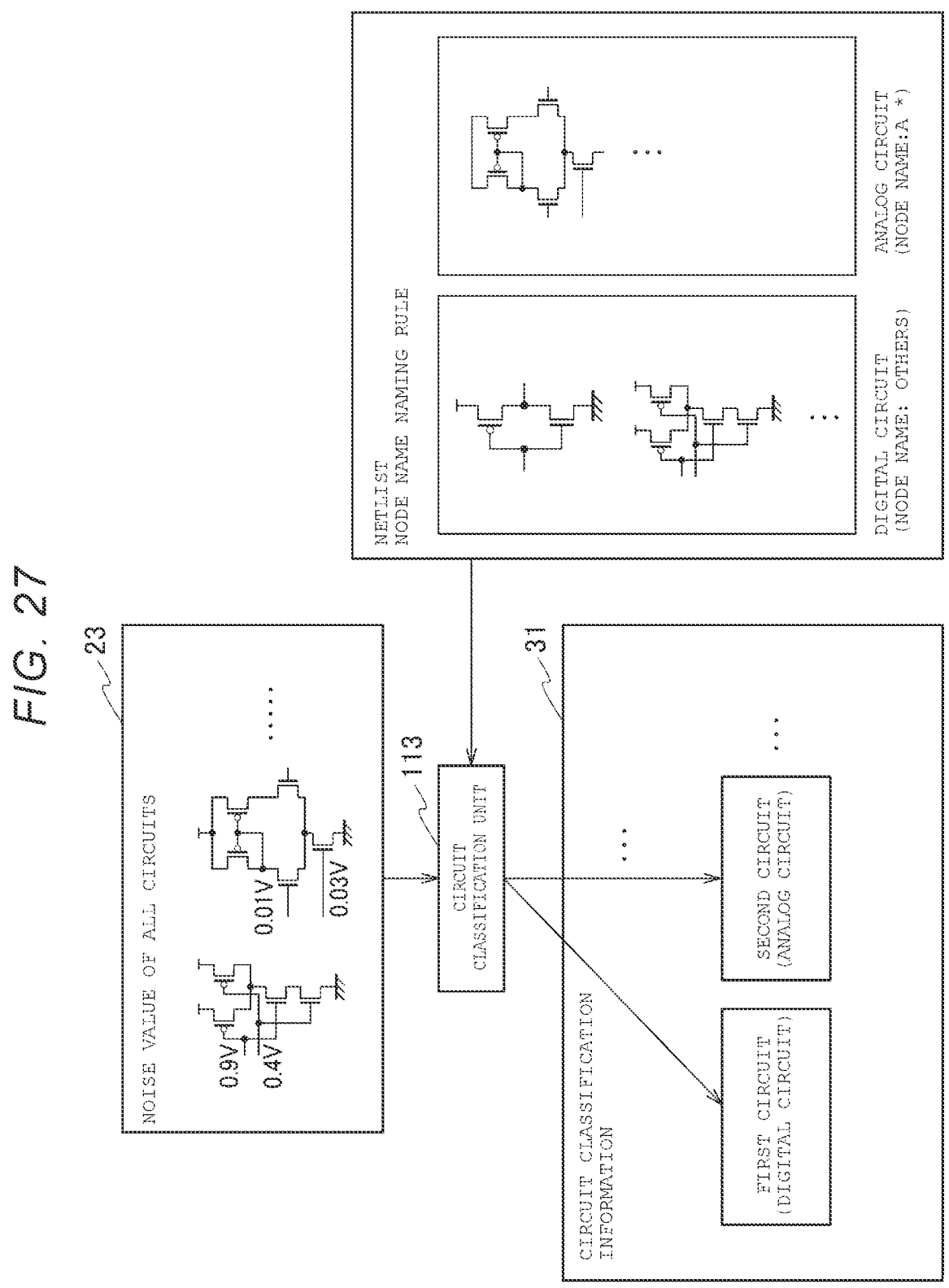
FIG. 27 relates to aspects of a circuit classification unit according to a sixth embodiment.

As shown in FIG. 27, the circuit classification unit 113E classifies the circuit structures provided in the target circuit 21A for each node name naming rule of the netlist 21. Specifically, the circuit classification unit 113E reads the noise information 23 of all circuits including the circuit structure of the target circuit 21A and the noise value corresponding to the circuit structure. As shown in FIG. 27, in the target circuit 21A provided in the netlist, the node name naming rule of the netlist 21 may be left as the node name in the case of the digital circuit, and may add "_*" so as to be listed "A_*" in the node name in a case of an analog circuit. The node name naming rule of the netlist 21 may further distinguish between the digital circuits and the analog circuits. In the following description, "for each node name naming rule of netlist 21" is also referred to as "for each circuit node".

Next, the circuit classification unit 113E detects the node name of the read target circuit 21A, and classifies the circuit structure of the target circuit 21A for each circuit type.

As shown in FIG. 27, the circuit classification unit 113E detects the case where there is no "_*" in the node name in the noise information 23 of all circuits as the digital circuit, sets the case as the first circuit type (digital circuit), and classifies the case in the circuit classification information 31 accordingly. Similarly, the circuit classification unit 113E detects the case where there is "_*" in the node name as an analog circuit, sets the case as the second circuit type (analog circuit), and classifies the case in the circuit classification information 31 accordingly.

(Circuit Noise Determination Method)

As shown in FIG. 28, first, in step S61, the reading unit 111 reads the netlist 21 (FIG. 25) having the noise analysis target circuit 21A and the analysis setting 21B.

In step S62, the noise calculation unit 112 calculates the noise values of all circuits according to the netlist 21.

In step S63, the circuit classification unit 113E detects and classifies the digital circuits and the analog circuits in the target circuit 21A for each circuit node name.

Finally, in step S64, based on the noise upper limit reference value for a plurality of noise determinations prepared for each circuit classification, the noise determination unit 114 (FIG. 25) outputs the circuit structure exceeding the noise upper limit reference value to the analysis report 25, with respect to the noise value generated by the circuit structure of the target circuit 21A provided in the circuit classification information 31.

Effect of Sixth Embodiment

As described above, according to the sixth embodiment, by classifying target circuits into digital circuits and analog circuits, and comparing the noise value for each classified circuit configuration with the noise upper limit reference value for each circuit classification, it is possible to provide a circuit noise determination system capable of detecting minute noise generated in a noise-sensitive circuit while preventing the generation of pseudo errors.

Seventh Embodiment (Circuit Noise Determination System)

As shown in FIG. 29, a CPU server 1F includes a noise determination program 11F that executes computer programs used in the circuit noise determination system 100. The CPU server 1F is another example of the CPU server 1. The noise determination program 11F is another example of the noise determination program 11.

As shown in FIG. 29, the CPU server 1F includes the noise determination program 11F instead of the noise determination program 11. Further, the storage medium 2 includes a first information storage unit 26F and a second information storage unit 27F instead of the first information storage unit 26 and the second information storage unit 27, respectively. The first information storage unit 26F includes the netlist 21 and the circuit library 22. The second information storage unit 27F includes noise information 23 and an analysis report 25. The circuit library 22 has circuit structures and a noise reference value 22C. The first information storage unit 26F is another example of the first information storage unit 26. The second information storage unit 27F is another example of the second information storage unit 27. Since other configurations have the same functions as those of the circuit noise determination system 100 according to the first embodiment, additional description thereof will be omitted.

The circuit structure and noise reference value 22C may incorporate circuit structure information, such as digital circuit types and the analog circuit types, prepared in advance for each circuit type. For example, the circuit structure and noise reference value 22C has a noise reference value corresponding to the circuit structure for each circuit information entry by circuit structure. Here, in the circuit structure and noise reference value 22C, circuit information of the circuit structure for each circuit type and the noise reference value corresponding to the circuit structure is registered. The circuit structure and noise reference value 22C is for a transistor-based circuit, and the minimum unit of the circuit structure to be registered is a transistor.

The noise determination program 11F includes the reading unit 111, the noise calculation unit 112, a circuit classification unit 113F, and a noise determination unit 114F. The noise determination program 11F outputs noise determination result information to the analysis report 25 after executing the noise determination. Since the reading unit 111 and the noise calculation unit 112 have the same functions as those of the circuit noise determination system 100 according to the first embodiment, additional description thereof will be omitted.

The circuit classification unit 113F includes a second circuit learning unit 129.

Figure 30A:
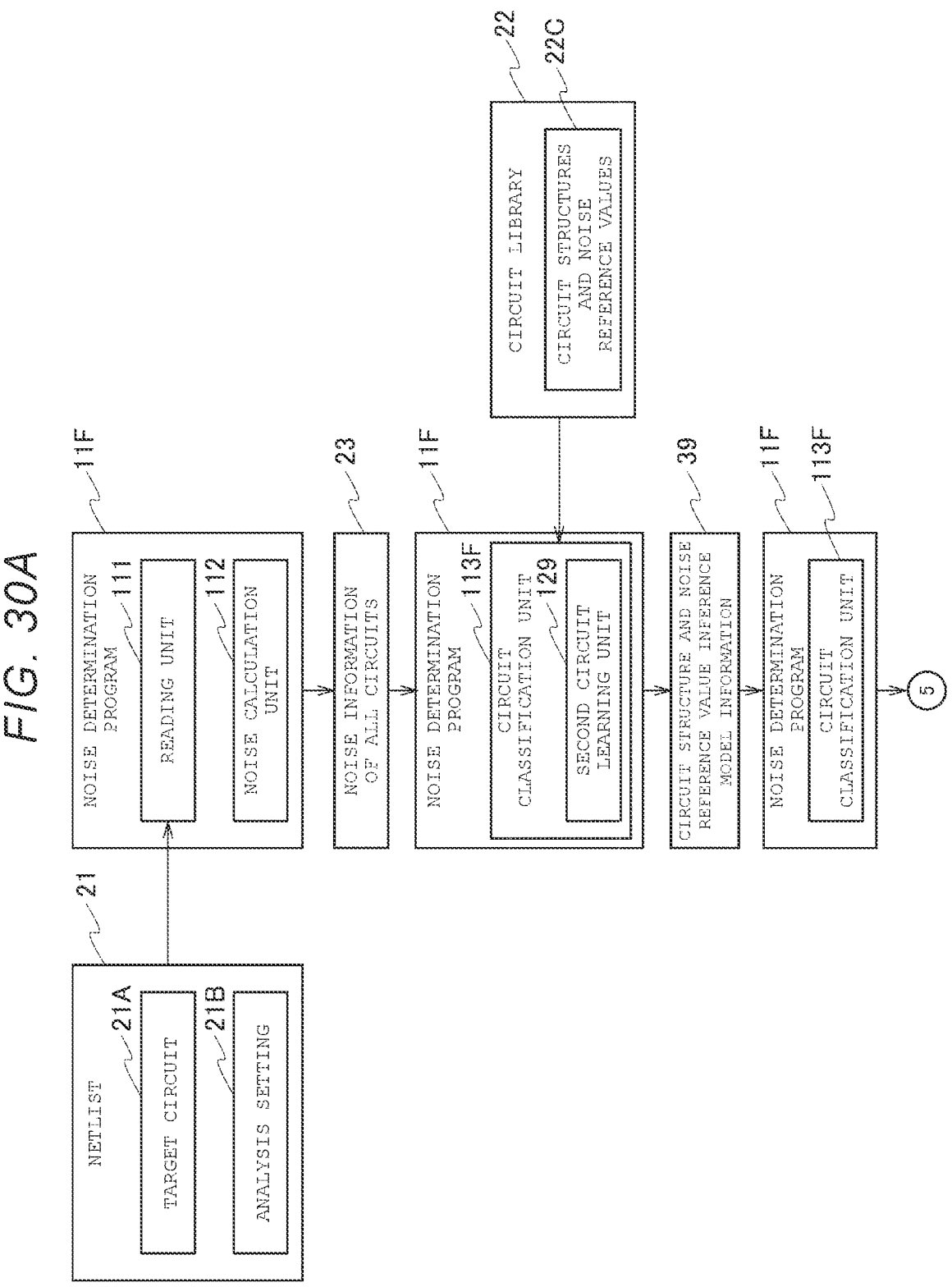

As shown in FIGS. 30A and 30B, the second circuit learning unit 129 learns the circuit structure and noise reference value from the circuit library 22 having the circuit structure and noise reference value 22C. The second circuit learning unit 129 outputs the learned circuit structure and noise reference value inference model information to the circuit structure inference model information 37. The second circuit learning unit 129 may output the learned circuit structure and noise reference value inference model information to the circuit classification unit 113F.

Based on the circuit library 22, the circuit classification unit 113F classifies the target circuit 21A by circuit inference processing using the circuit structure and noise reference value inference model information. That is, the circuit classification unit 113F classifies the circuit structures provided in the target circuit 21A for each circuit type, and outputs the circuit classification information to the circuit classification information 31F. For example, the circuit classification unit 113F may read the circuit library 22 (having the circuit structures and noise reference value 22C) and the noise information 23. Further, the circuit classification unit 113F may output the circuit classification information to the noise determination unit 114. The circuit classification unit 113F will be further described with reference to FIG. 31.

Figure 31:
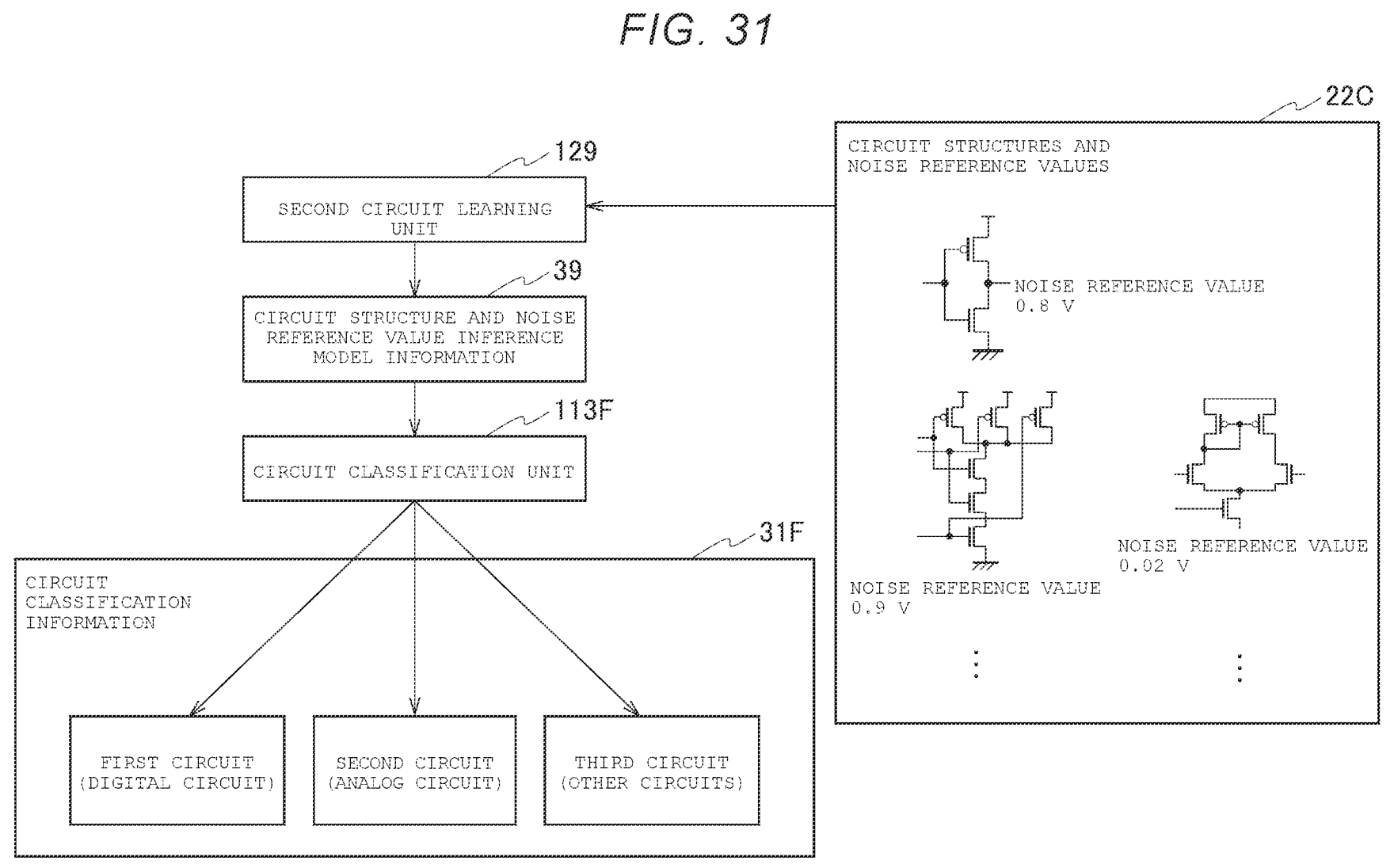

As shown in FIG. 31, the second circuit learning unit 129 generates the circuit structure and noise reference value inference model information through learning based on the circuit library 22. Specifically, the second circuit learning unit 129 reads the circuit structure of the circuit library having the circuit structure and noise reference value 22C prepared in advance.

Next, the second circuit learning unit 129 learns the circuit structure of the digital circuits and the analog circuits, and the noise reference value corresponding to the circuit structures based on the circuit structure and noise reference value 22C. The second circuit learning unit 129 outputs the learning result to the circuit structure and noise reference value inference model information 39. The second circuit learning unit 129 will be further described with reference to FIG. 32.

The circuit classification unit 113F reads the noise information 23 and the circuit structure of all circuits. For example, the circuit classification unit 113F classifies the circuit structure of the target circuit 21A for each circuit type by circuit and noise reference value inference processing. In the following description, classifying for each circuit type using the circuit structure and noise reference value inference model information 39 is also referred to as circuit and noise reference value inference processing.

Based on the noise reference value of the circuit structure and noise reference value inference model information 39 for a plurality of noise determinations prepared for each circuit classification, the noise determination unit 114F outputs the circuit structures of target circuit 21A exceeding the noise reference value for the circuit structure along with the noise reference value inference model information 39 to the analysis report 25. The noise reference value of the circuit structure and noise reference value inference model information 39 is another example of the noise upper limit reference value 24 for each circuit classification.

Figure 32:
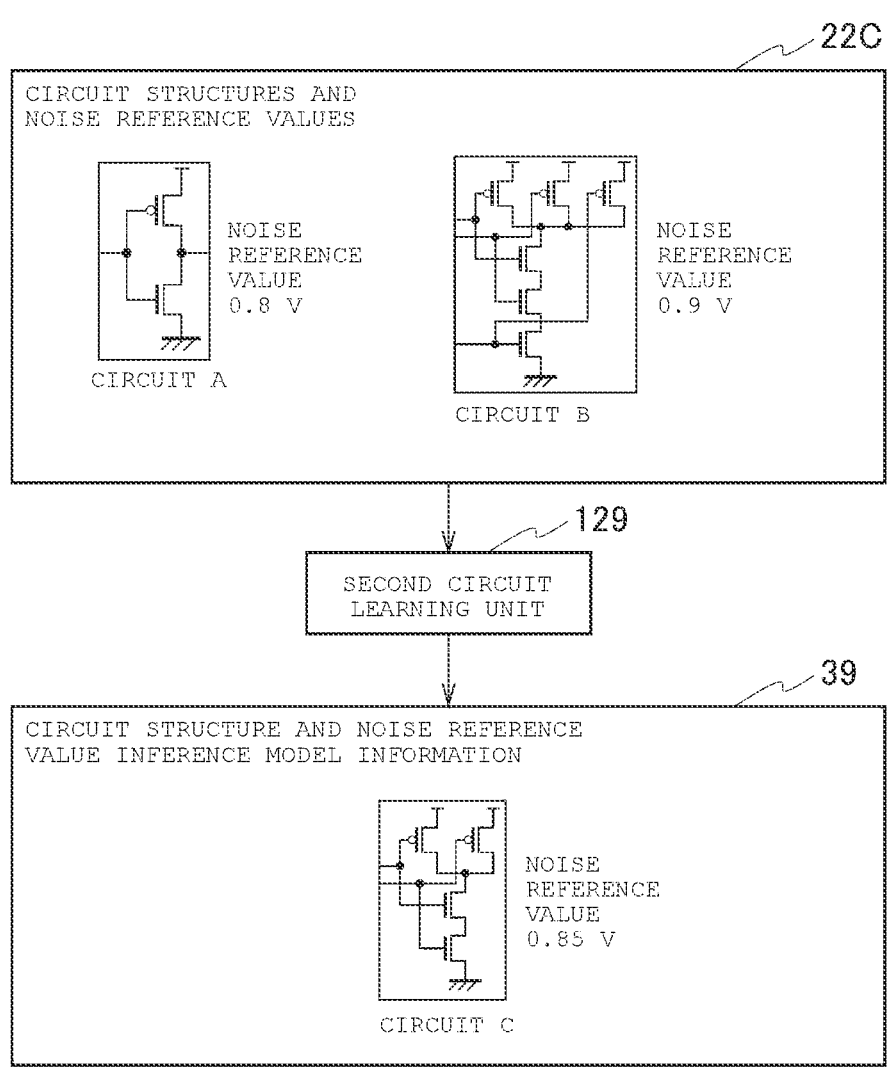
FIG. 32 relates to aspects of a second circuit learning unit according to a seventh embodiment.

As shown in FIG. 32, the second circuit learning unit 129 generates the circuit structure and noise reference value inference model information based on the circuit structure and noise reference value 22C. Specifically, the second circuit learning unit 129 learns from information of the circuit A (NAND circuit) in the circuit structure and noise reference value 22C, and the noise reference value 0.8V corresponding to the circuit structure, the circuit B (3-input NAND circuit) in the circuit structure and noise reference value 22C, and the noise reference value 0.9V corresponding to the circuit structure, and outputs the information to the circuit C (2-input NAND circuit), and the circuit structure and noise reference value inference model information 39 as the noise reference value 0.85V corresponding to the circuit structure.

(Circuit Noise Determination Method)

Figure 33:
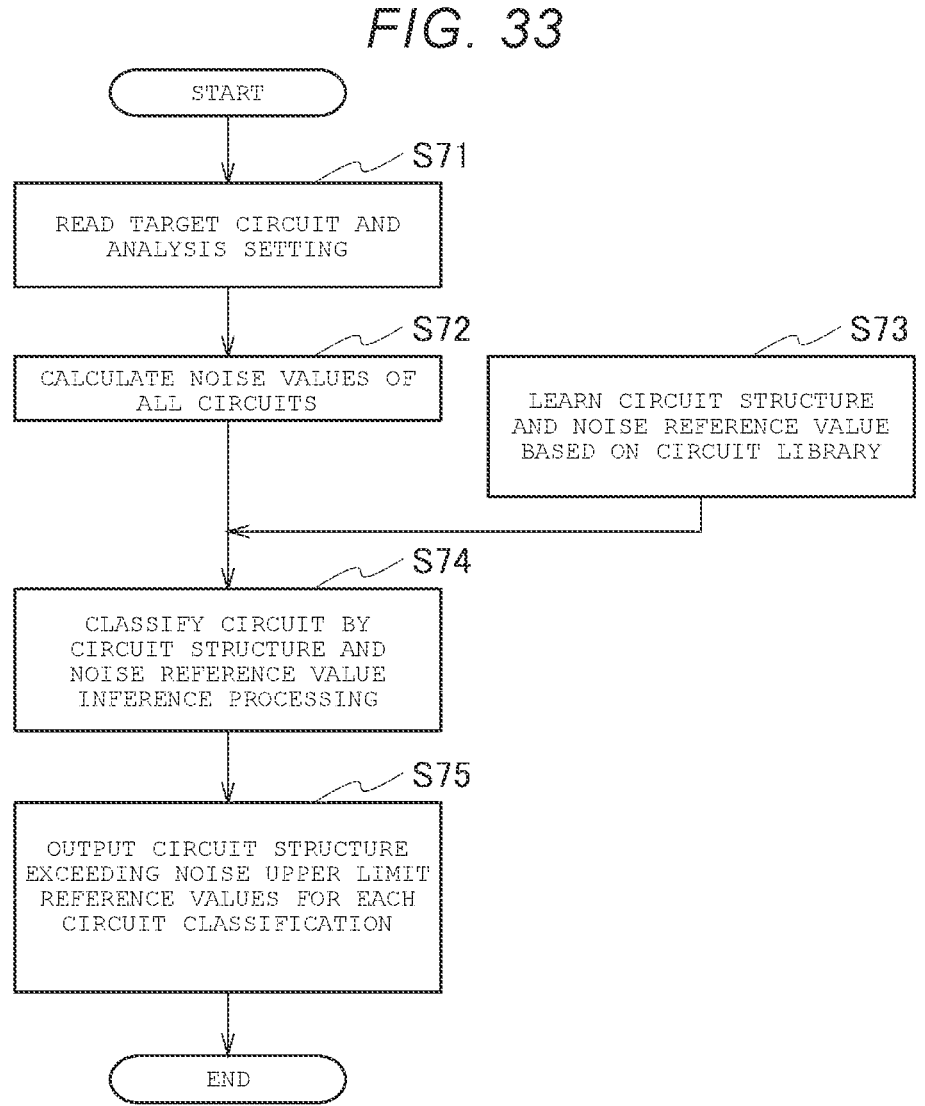
FIG. 33 is an example of a circuit noise determination method according to a seventh embodiment.

As shown in FIG. 33, first, in step S71, the reading unit 111 reads the netlist 21 (FIG. 29) having the noise analysis target circuit 21A and the analysis setting 21B.

In step S72, the noise calculation unit 112 calculates the noise values of all circuits according to the netlist 21.

In step S73, the second circuit learning unit 129 learns the circuit structures and noise reference values based on the circuit library 22 (FIG. 29) having the circuit structure and noise reference value 22C. Specifically, the second circuit learning unit 129 learns the circuit structures and noise reference values from the circuit structure and noise reference value 22C.

In step S74, the circuit classification unit 113F detects and classifies the digital circuit and the analog circuit provided in the target circuit 21A by circuit inference processing.

In step S75, based on the circuit structure and noise reference value inference model information for a plurality of noise determinations prepared for each circuit classification, the noise determination unit 114F outputs the circuit structure exceeding the noise upper limit reference value to the analysis report 25, with respect to the noise value generated by the circuit structure of the target circuit 21A provided in the circuit classification information 31F.

Effect of Seventh Embodiment

As described above, according to the seventh embodiment, by classifying target circuits into digital circuits and analog circuits and comparing the noise value for each classified circuit configuration with the noise upper limit reference value for the appropriate circuit classification, it is possible to provide a circuit noise determination system capable of detecting minute noise generated in a noise-sensitive circuit while preventing the generation of pseudo errors.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A circuit noise determination system, comprising:
a reading unit configured to read a netlist from a storage medium, the netlist representing a target circuit and including noise analysis settings;
a noise calculation unit configured to calculate noise values of circuit elements of the target circuit according to the netlist;
a circuit classification unit configured to identify and classify circuit elements in the target circuit; and
a noise determination unit configured to output the circuit elements in the target circuit having a calculated noise value exceeding a noise upper limit reference value set for each circuit element classification, the noise upper limit reference value for each circuit element classification being set based on a plurality of noise determinations performed for each circuit element classification.

2. The circuit noise determination system according to claim 1, wherein the circuit classification unit identifies circuit elements of the target circuit based on comparison to a circuit library in which a plurality of circuit elements are registered.

3. The circuit noise determination system according to claim 2, wherein circuit elements in the circuit library are sorted into different classifications in advance.

4. The circuit noise determination system according to claim 2, wherein
the circuit classification unit includes:
a first circuit learning unit configured to learn to distinguish between different circuit elements from the circuit library, and
the circuit elements of the target circuit are classified by circuit inference processing based on circuit structure inference model information generated by the first circuit learning unit.

5. The circuit noise determination system according to claim 4, wherein the first circuit learning unit includes:
a binary decision graph generation unit configured to generate a binary decision graph from the circuit library.

6. The circuit noise determination system according to claim 4, wherein the circuit library has labeled circuit element information prepared in advance.

7. The circuit noise determination system according to claim 2, wherein
the circuit classification unit includes:
a second circuit learning unit configured to learn to distinguish between circuit elements from the circuit library and learn noise reference values for the circuit elements from the circuit library, and the circuit elements of the target circuit are classified by circuit type and noise reference value inference processing based on circuit element and noise reference value inference model information generated by the second circuit learning unit.

8. The circuit noise determination system according to claim 7, wherein the circuit library has circuit elements associated with a noise reference value in advance.

9. The circuit noise determination system according to claim 1, wherein
the circuit classification unit includes:
a digital circuit path detection unit configured to detect a digital circuit path in the target circuit, and
a path detection determination unit configured to determine whether the digital circuit path detection unit has been able to detect a circuit path in the target circuit,
circuit structures in the target circuit are classified as a digital circuit or an analog circuit according to a digital circuit path detection determination result, and
the noise determination unit is configured to calculate a noise value separately for digital circuits and analog circuits.

10. The circuit noise determination system according to claim 1, wherein
the circuit classification unit includes:
a circuit hierarchy detection unit configured to determine a hierarchy of circuit structures in the target circuit,
a logic extraction unit configured to extract logic of the circuit structures in the hierarchy, and
a logic extraction determination unit configured to determine whether the logic extraction unit has been able to extract logic of circuit structures,
the circuit structures are classified as a digital circuit structure or an analog circuit structure according to a logic extraction determination result, and
the noise determination unit is configured to calculate noise values separately for each of the digital circuit structures and the analog circuit structures.

11. The circuit noise determination system according to claim 1, wherein the circuit classification unit classifies the circuit elements in the target circuit based on a circuit node name.

12. A circuit noise determination method, comprising:
reading a netlist representing a target circuit and including noise analysis settings;
calculating noise values of circuit elements of the target circuit according to the netlist;
identifying and classifying circuit elements of the target circuit as digital circuits and analog circuits; and outputting a notification of circuit elements exceeding a noise upper limit reference value set for each circuit element classification, the noise upper limit reference value for each circuit element classification being set based on a plurality of noise determinations prepared for each circuit element classification.

13. The circuit noise determination method according to claim 12, wherein circuit elements of the target circuit are identified based on comparison to a circuit library in which a plurality of circuit elements are registered.

14. The circuit noise determination method according to claim 13, wherein circuit elements in the circuit library are sorted into different classifications in advance.

15. The circuit noise determination method according to claim 12, wherein the circuit elements of the target circuit are classified by circuit inference processing based on circuit structure inference model information.

16. The circuit noise determination method according to claim 12, the method further comprising:
detecting a digital circuit path in the target circuit, and
classifying circuit structures in the target circuit as a digital circuit or an analog circuit according to a digital circuit path detection determination result.

17. A non-transitory, computer-readable medium storing program instructions of a circuit noise determination program which when executed causes a computer to perform a method comprising:
reading a netlist representing a target circuit and including noise analysis settings;
calculating noise values of circuit elements of the target circuit according to the netlist;
identifying and classifying circuit elements of the target circuit as digital circuits and analog circuits; and
outputting a notification of circuit elements exceeding a noise upper limit reference value set for each circuit element classification, the noise upper limit reference value for each circuit element classification being set based on a plurality of noise determinations prepared for each circuit element classification.

18. The non-transitory, computer-readable medium according to claim 17, wherein circuit elements of the target circuit are identified based on comparison to a circuit library in which a plurality of circuit elements are registered.

19. The non-transitory, computer-readable medium according to claim 18, wherein circuit elements in the circuit library are sorted into different classifications in advance.

20. The non-transitory, computer-readable medium according to claim 17, wherein the circuit elements of the target circuit are classified by circuit inference processing based on circuit structure inference model information.

* * * * *